(12) United States Patent
Toguchi et al.

(10) Patent No.: US 6,582,837 B1
(45) Date of Patent: Jun. 24, 2003

(54) ORGANIC ELECTROLUMINESCENCE DEVICE

(75) Inventors: Satoru Toguchi, Tokyo (JP); Atushi Oda, Tokyo (JP); Hitoshi Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 499 days.

(21) Appl. No.: 09/112,364

(22) Filed: Jul. 9, 1998

(30) Foreign Application Priority Data

| Jul. 14, 1997 | (JP) | .............................................. 9-188639 |
| Nov. 20, 1997 | (JP) | .............................................. 9-319430 |
| Feb. 12, 1998 | (JP) | .............................................. 10-029996 |
| Apr. 15, 1998 | (JP) | .............................................. 10-104564 |

(51) Int. Cl.$^7$ .............................................. H05B 33/12
(52) U.S. Cl. ........................ 428/690; 428/917; 313/504; 313/506
(58) Field of Search ................................. 428/690, 917; 313/504, 506

(56) References Cited

U.S. PATENT DOCUMENTS

| 5,635,308 | A | * | 6/1997 | Inoue et al. | ................. 428/690 |
| 5,759,444 | A | * | 6/1998 | Enokida et al. | ........ 252/301.16 |
| 5,985,417 | A | * | 11/1999 | Shi et al. | .................... 428/195 |

FOREIGN PATENT DOCUMENTS

| JP | 54-71090 | 6/1979 |
| JP | 62-76576 | 4/1987 |
| JP | 5-94875 | 4/1993 |
| JP | 7-138561 | 5/1995 |
| JP | 7-224012 | 8/1995 |
| JP | 8-12600 | 1/1996 |
| JP | 8-20771 | 1/1996 |
| JP | 8-40997 | 2/1996 |
| JP | 8-53397 | 2/1996 |
| JP | 8-87122 | 4/1996 |
| JP | 8-239655 | 9/1996 |
| JP | 8-239656 | 9/1996 |
| JP | 8-245643 | 9/1996 |
| JP | 8-269133 | 10/1996 |
| JP | 8-333569 | 12/1996 |
| JP | 11-111458 | 4/1999 |
| JP | 11-111460 | 4/1999 |
| JP | 3008917 | 12/1999 |

OTHER PUBLICATIONS

English language translation of JP 8–333569 (Dec. 1996).*

* cited by examiner

Primary Examiner—Marie Yamnitzky
(74) Attorney, Agent, or Firm—Young & Thompson

(57) ABSTRACT

An organic electroluminescence device having one or more organic thin layers including a luminescent layer between an anode and a cathode, wherein at least one of the organic thin layers contains a compound or compounds selected from the group consisting of particular bianthryl, binaphthyl, trianthrylene and naphthylanthracene compounds, alone or in combination, the general formula of bianthryl compound being shown as follows:

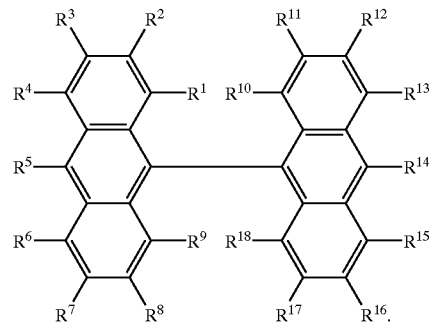

11 Claims, 1 Drawing Sheet

ORGANIC ELECTROLUMINESCENCE DEVICE

BACKGROUND OF THE INVENTION

1. Field of the Invention

This invention relates to an electroluminescence(EL) device with excellent luminescence properties.

2. Description of the Related Art

An organic electroluminescence device is a self-light emitting device utilizing the principle that applying an electric field to a fluorescent substance causes its light emission through recombination energy of positive holes injected from an anode and electrons from a cathode. Since C. W. Tang et al reported an organic EL device of a layered type driven by a low voltage (C. W. Tang, S. A. VanSlyke, Applied Physics Letters, Vol.51, 913(1987)), an organic EL device composed of organic materials has been intensively investigated. Tang et al. has used tris(8-hydroxyquinoline) aluminum in a luminescent layer and a triphenyl diamine derivative in a hole-transporting layer. A layered structure has advantages such as an improved efficiency of injecting positive holes into a luminescent layer; an improved efficiency of generating excitons obtained from carrier recombination, by blocking electrons injected from a cathode; and confinement of excitons generated in a luminescent layer. As is shown above, well-known structures for an organic EL device include a two-layer type comprising a hole-transporting(injection) layer and an electron-transporting luminescent layer, and a three-layer type comprising a hole-transporting(injection) layer, a luminescent layer and an electron-transporting (injection) layer. In these layered structures of devices, various device structures and manufacturing processes have been devised for improving an efficiency of recombination of injected positive holes and electrons.

Conventionally known light emission materials are chelate complexes such as tris(8-hydroxyquinoline) aluminum complex, coumarin derivatives, tetraphenylbutadiene derivatives, bisstyryl arylenes and oxadiazole derivatives. It has been reported that they may give a luminescent color in the visible region from blue to red, and thus they are promising for realizing a color-display device(e.g., JP-A 8-239655, JP-A 7-138561 and JP-A 3-200889).

Electron-transporting materials are well-known e.g., oxadiazole derivatives and triazole derivatives.

Hole-transporting materials are well-known, e.g., triphenylamines and aromatic diamines such as 4,4',4"-tris(3-methylphenylphenylamino)triphenylamine, which is a starburst molecule, and N,N'-diphenyl-N,N'-bis(3-methylphenyl)-[1,1'-biphenyl]-4,4'-diamine (e.g., JP-A 8-20771, JP-A 8-40995, JP-A 8-40997, JP-A 8-53397, JP-A 8-87122). Recently, 3,3'-diamino-1,1'-binaphtyl derivatives have been disclosed in JP-A 9-255948. It has been described that the above compound has a higher glass-transition temperature, and thus, when used as a hole-transporting material, may give an organic EL device highly reliable under a drive condition of a high current density. There is, however, a problem of a low luminance.

SUMMARY OF THE INVENTION

There have been recently disclosed or reported organic EL devices with a high luminance and a long life, which are, however, not necessarily satisfactory. It has been, therefore, desired to develop materials exhibiting a high performance.

Thus, an objective of this invention is to provide an organic EL device with an improved luminance.

We have intensely investigated for solving the above problems, and have obtained the following observations on an organic EL device prepared by using at least one of the compounds selected from the group consisting of;

(1) particular bianthryl compounds[I],
(2) particular binaphthyl compounds[II],
(3) particular trianthrylene compounds[III], and
(4) particular naphthylanthracene compounds[IV] as a luminescent material, leading to this invention.

1. An organic EL device prepared by using the particular bianthryl compound[I] can exhibit a higher-luminance luminescence than a conventional one. The material has a good carrier transport property. An organic EL device prepared by using the material as a hole- or electron-transporting material, or by using a mixture layer of the above material and another hole- or electron-transporting material, may exhibit a higher-luminance luminescence than a conventional one. An organic EL device may give a particularly high-luminance luminescence, when employing the above bianthryl compound substituted with a diarylamino group as a luminescent, hole-transporting or electron-transporting material. An organic EL device may give a particularly high-luminance luminescence, when employing the above bianthryl compound whose aryl group is substituted with a styryl group, as a luminescent, hole-transporting or electron-transporting material.

2. A luminance of an organic EL device may be improved by using the particular binaphthyl compound[II] in a hole-transporting layer. In addition, an organic EL is provided, in which the binaphthyl compound is used as a luminescent material and/or an electron-transporting material.

3. An organic EL device prepared by using the particular trianthrylene compound[III] can exhibit a higher-luminance luminescence than a conventional one. The material has a good carrier transport property. An organic EL device may exhibit a higher-luminance luminescence than a conventional one, by forming a hole- or electron-transporting layer made of the material or of a mixture of the material and another hole- or electron-transporting material.

An organic EL device may give a particularly high-luminance luminescence, when employing the above trianthrylene compound substituted with a diarylamino group as a luminescent, hole-transporting or electron-transporting material. An organic EL device may give a particularly high-luminance luminescence, when employing the above trianthrylene compound whose aryl group is substituted with a styryl group, as a luminescent, hole-transporting or electron-transporting material.

4. An organic EL device prepared by using the particular naphthylanthracene compound[IV] can exhibit a higher-luminance luminescence than a conventional one. The material has a good carrier transport property. An organic EL device may exhibit a higher-luminance luminescence than a conventional one, by forming a hole- or electron-transporting layer made of the material or of a mixture of the material and another hole- or electron-transporting material.

An organic EL device may give a particularly high-luminance luminescence, when employing the above naphthylanthracene compound substituted with a diarylamino group as a luminescent, hole-transporting or electron-transporting material. An organic EL device may give a particularly high-luminance luminescence, when employing the above naphthylanthracene compound whose aryl group is substituted with a styryl group, as a luminescent, hole-transporting or electron-transporting material.

An organic EL device according to this invention which employs a compound or compounds selected from the group consisting of the above four types of compounds, can exhibit a higher-luminance luminescence than a conventional one, indicating that this invention is highly effective.

Figure 1:
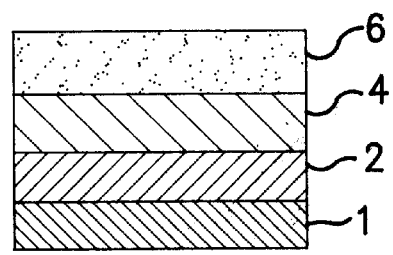
FIGS. 1 to 4 are cross-sections of examples of an organic EL device according to this invention, wherein 1 is a substrate, 2 is an anode, 3 is a hole-transporting layer, 4 is a luminescent layer, 5 is an electron-transporting layer and 6 is a cathode.

DETAILED DESCRIPTION OF THE INVENTION (1) The above particular bianthryl compounds are represented by the general formula [I]-(1);

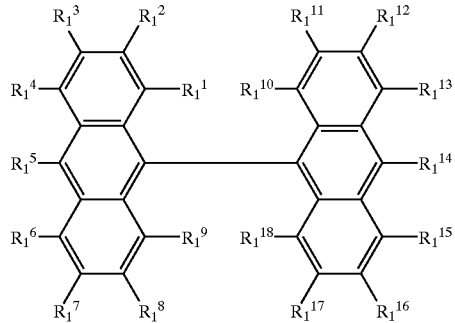

[I]-(1)

wherein $R_1^1$ to $R_1^{18}$ independently represent hydrogen, halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_1^1$ to $R_1^{18}$ may be combined together to form a ring; or [I]-(2)

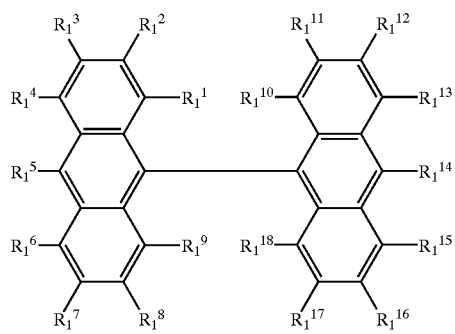

[I]-(2)

wherein $R_1^1$ to $R_1^{18}$ independently represent hydrogen, halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_1^1$ to $R_1^{18}$ may be combined together to form a ring, although at least one of $R_1^1$ to $R_1^{18}$ is a diarylamino group represented by $-NAr_1^1 Ar_1^2$ wherein $Ar_1^1$ and $Ar_1^2$ independently represent a substituted or unsubstituted aryl group having 6 to 20 carbon atoms.

In the above $R_1^1$ to $R_1^{18}$, the halogen atom may be fluorine, chlorine, bromine or iodine.

The substituted or unsubstituted amino group may be represented by $-NX^1X^2$, wherein $X^1$ and $X^2$ may be independently hydrogen, methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 4-styrylphenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl,m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8- phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl or 4-t-butyl-3-indolyl.

The substituted or unsubstituted alkyl group may be methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl or 1,2,3-trinitropropyl.

The substituted or unsubstituted alkenyl group may be vinyl, allyl, 1-butenyl, 2-butenyl, 3-butenyl, 1,3-butadienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl or 3-phenyl-1-butenyl.

The substituted or unsubstituted alkenyl group may be cyclopropyl, cyclobutyl, cyclopentyl, cyclohexyl and 4-methylcyclohexyl.

The substituted or unsubstituted alkoxy group is represented by —OY, wherein Y may be ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl or 1,2,3-trinitropropyl.

The substituted or unsubstituted aromatic hydrocarbon group may be phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl or 4"-t-butyl-p-terphenyl-4-yl.

The substituted or unsubstituted aromatic heterocyclic group may be 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9- phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2- phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl or 4-t-butyl-3-indolyl.

The substituted or unsubstituted aralkyl group may be benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydoxy-2-phenylisopropyl or 1-chloro-2-phenylisopropyl.

The substituted or unsubstituted aryloxy group is represented by —OZ, wherein Z may be phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl or 4-t-butyl-3-indolyl.

The substituted or unsubstituted alkoxycarbonyl group is represented by —COOY', wherein Y' may be methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl or 1,2,3-trinitropropyl.

Bivalent groups which may form a ring include tetramethylene, pentamethylene, hexamethylene, diphenylmethan-2,2'-diyl, diphenylethan-3,3'-diyl and diphenylpropan-4,4'-diyl.

Preferable compounds for this invention are those represented by formula [I]-(2), wherein at least one of $R_1^1$ to $R_1^{18}$ is $—NAr_1^1Ar_1^2$ wherein $Ar_1^1$ and $Ar_1^2$ independently represent a substituted or unsubstituted aryl group having 6 to 20 carbon atoms; and the remaining groups among $R_1^1$ to $R_1^{18}$ independently represent hydrogen, halogen, hydroxy, the above substituted or unsubstituted amino, nitro, cyano, the above substituted or unsubstituted alkyl, the above substituted or unsubstituted alkenyl, the above substituted or unsubstituted cycloalkyl, the above substituted or unsubstituted alkoxy, the above substituted or unsubstituted aromatic hydrocarbon, the above substituted or unsubstituted aromatic heterocycle, the above substituted or unsubstituted aralkyl, the above substituted or unsubstituted aryloxy, the above substituted or unsubstituted alkoxycarbonyl, or carboxyl groups; or two of $R_1^1$ to $R_1^{18}$ may be combined together to form a ring. The aryl group having 6 to 20 carbon atoms may be phenyl, naphthyl, anthryl, phenanthryl, naphthacenyl or pyrenyl. These aryl groups may be substituted with a halogen, hydroxy, the above substituted or unsubstituted amino, nitro, cyano, the above substituted or unsubstituted alkyl, the above substituted or unsubstituted alkenyl, the above substituted or unsubstituted cycloalkyl, the above substituted or unsubstituted alkoxy, the above substituted or unsubstituted aromatic hydrocarbon, the above substituted or unsubstituted aromatic heterocycle, the above substituted or unsubstituted aralkyl, the above substituted or unsubstituted aryloxy, the above substituted or unsubstituted alkoxycarbonyl, or carboxyl groups.

The styryl group which $Ar_1^1$ and $Ar_1^2$ may have as a substituent group, may be selected from unsubstituted styryl, 2,2-diphenylvinyl, as well as substituted styryl and 2,2-diphenylvinyl groups whose terminal phenyl has substituent groups such as a halogen, hydroxy, the above substituted or unsubstituted amino, nitro, cyano, the above substituted or unsubstituted alkyl, the above substituted or unsubstituted alkenyl, the above substituted or unsubstituted cycloalkyl, the above substituted or unsubstituted alkoxy, the above substituted or unsubstituted aromatic hydrocarbon, the above substituted or unsubstituted aromatic heterocycle, the above substituted or unsubstituted aralkyl, the above substituted or unsubstituted aryloxy, the above substituted or unsubstituted alkoxycarbonyl and carboxyl groups.

Examples of the compounds belonging to the above [I] of this invention will be shown below, to which this invention is not limited.

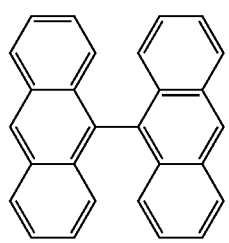

[I]-(3)

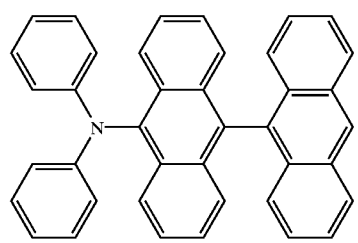

[I]-(4)

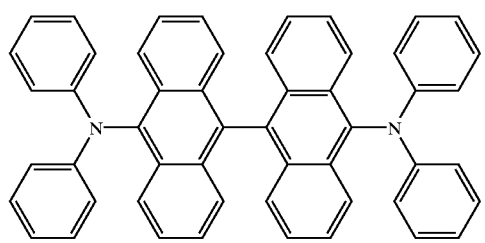

[I]-(5)

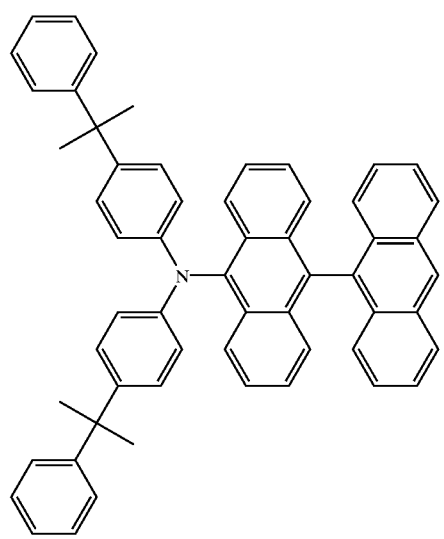

[I]-(6)

[I]-(7)

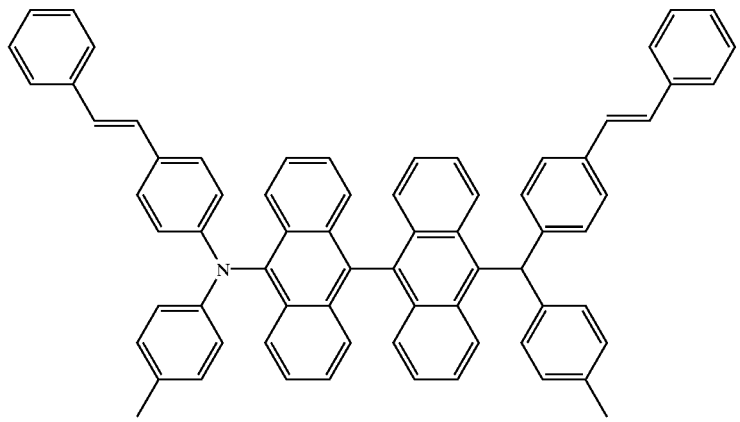

(2) The above particular binaphthyl compound [II] may be represented by general formula [II]-(1);

[II]-(1)

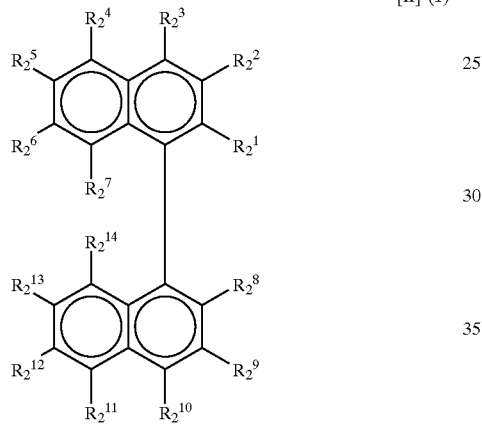

wherein $R_2^1$ to $R_2^{14}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or to unsubstituted aralkyl, a substituted or unsubstituted aryloxy, a substituted or unsubstituted alkoxycarbonyl, or carboxyl groups; or two of $R_2^1$ to $R_2^7$ and/or two of $R_2^8$ to $R_2^{14}$ may form a ring; or [II]-(2);

[II]-(2)

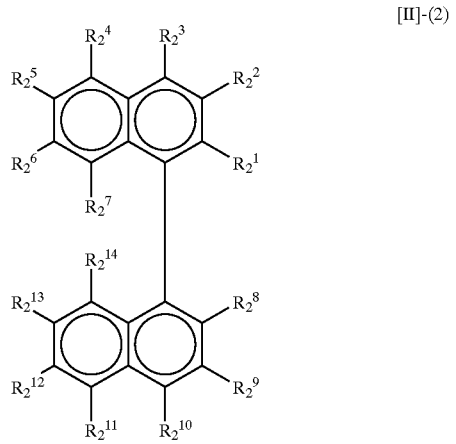

wherein $R_2^1$ to $R_2^{14}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_2^1$ to $R_2^7$ and/or two of $R_2^8$ to $R_2^{14}$ may form a ring, although at least one of $R_2^1$ to $R_2^{14}$ is a diarylamino group represented by $—NAr_2^1Ar_2^2$ wherein $Ar_2^1$ is a substituted aryl group having 6 to 20 carbon atoms which has at least one styryl substituent and $Ar_2^2$ is a substituted or unsubstituted aryl group having 6 to 20 carbon atoms.

For the above $R_2^1$ to $R_2^{14}$, specific examples of the halogen, the substituted or unsubstituted amino, the substituted or unsubstituted alkyl, the substituted or unsubstituted alkenyl, the substituted or unsubstituted cycloalkyl, the substituted or unsubstituted alkoxy, the substituted or unsubstituted aromatic hydrocarbon, the substituted or unsubstituted aromatic heterocycle, the substituted or unsubstituted aralkyl, the substituted or unsubstituted aryloxy, and the substituted or unsubstituted alkoxycarbonyl, are as described for the above $R_1^1$ to $R_1^{18}$. Examples of the ring formed by two of $R_2^1$ to $R_2^7$ and/or two of $R_2^8$ to $R_2^{14}$; of the substituted or unsubstituted aryl group having 6 to 20 carbons; and of the styryl group, are also as described for $R_1^1$ to $R_1^{18}$ for the compounds in [I].

Specifically, 4,4'-bis(diphenylamino)-1,1'-binaphthyl, 4,4'-bis(phenyl-p-triamino)-1,1'-binaphthyl, 4-(di-p-triamino)-1,1'-binaphthyl and 4,4'-bis(di-p-triamino)-1,1'-binaphthyl may be practically useful examples.

More specifically, 3,3'-dimethyl-bis(diarylamino)-1,1'-binaphthyls, especially 1,1'-binaphthyls having a styryl-substituted diphenylamino group represented by formulas [II]-(3), [II]-(4) or [II]-(5), are preferable and practically useful because they can provide a high-luminance luminescent layer. This invention should not be, however, limited to these specific examples.

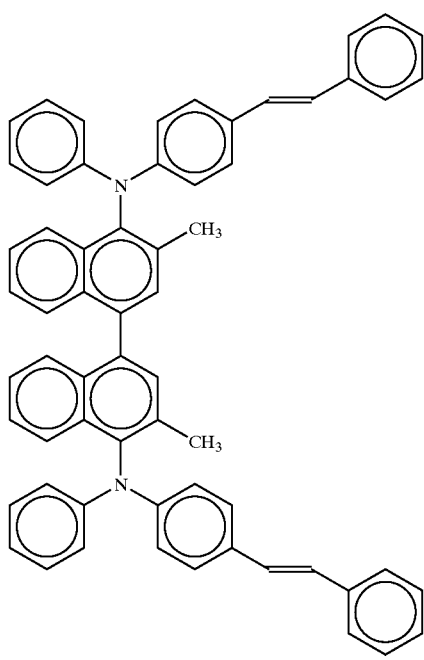
[II]-(3)
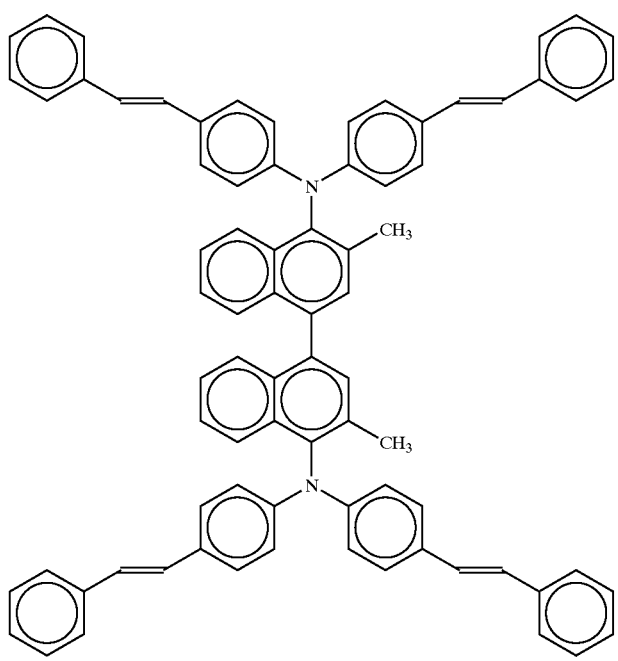
[II]-(4)

-continued

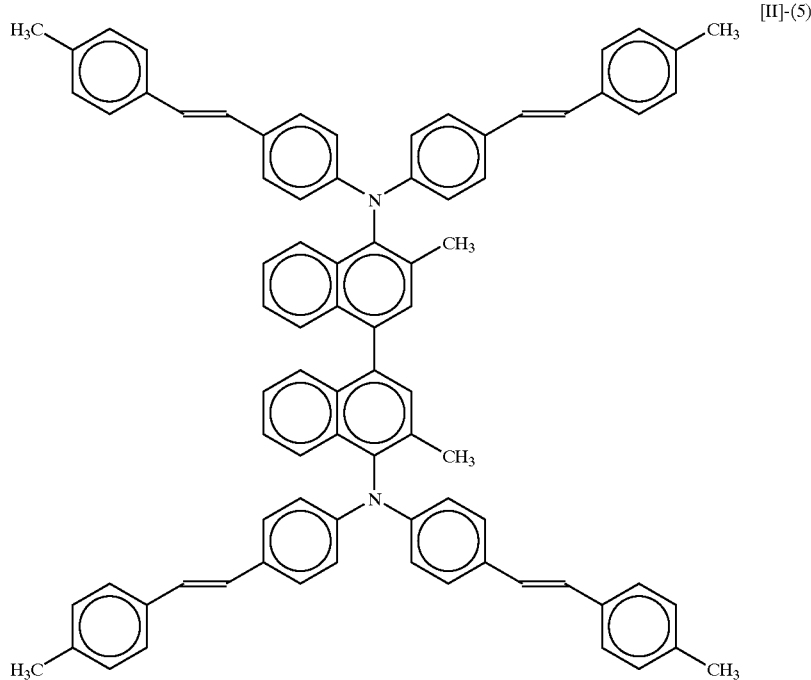
[II]-(5)

The compounds in [II] may be prepared by a conventionally known process. For example, a binaphthyl compound having a diphenylamino group may be prepared by Ullmann reaction of an amine having a binaphthyl structure with an aromatic halogen compound, or of a halogen compound having a binaphthyl structure with an aromatic amine. A styryl derivative may be prepared by well-known Wittig-Horner reaction.

(3) The above particular trianthrylene compound [III] may be represented by general formula [III]-(1);

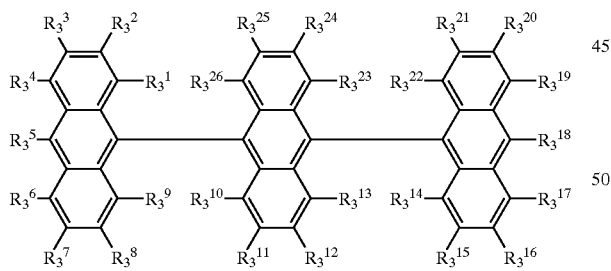
[III]-(1)

wherein $R_3^1$ to $R_3^{26}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_3^1$ to $R_3^{26}$ may form a ring; or [III]-(2);

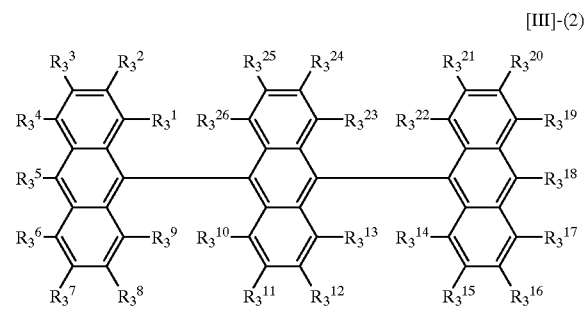
[III]-(2)

wherein $R_3^1$ to $R_3^{26}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_3^1$ to $R_3^{26}$ may form a ring, although at least one of $R_3^1$ to $R_3^{26}$ is a diarylamino group represented by —$NAr_3^1Ar_3^2$ wherein $Ar_3^1$ and $Ar_3^2$ are independently a substituted or unsubstituted aryl group having 6 to 20 carbon atoms, and at least one of $Ar_3^1$ and $Ar_3^2$ has at least one styryl group as a substituent.

For the above $R_3^1$ to $R_3^{26}$ specific examples of the halogen, the substituted or unsubstituted amino, the substituted or unsubstituted alkyl, the substituted or unsubstituted alkenyl, the substituted or unsubstituted cycloalkyl, the substituted or unsubstituted alkoxy, the substituted or unsubstituted aromatic hydrocarbon, the substituted or unsubsti tuted aromatic heterocycle, the substituted or unsubstituted aralkyl, the substituted or unsubstituted aryloxy, and the substituted or unsubstituted alkoxycarbonyl, are as described for the above $R_1^1$ to $R_1^{18}$. Examples of the ring formed by two of $R_3^1$ to $R_3^{26}$; of the aryl group having 6 to 20 carbons; and of the styryl group, are also as described for $R_1^1$ to $R_1^{18}$ for the compounds in [I].

Examples of the compounds in [III] are, but not limited to, [III]-(3): tri-9,10-anthrylene; [III]-(4): 10-di-p-tolylaminotri-9,10-anthrylene; [III]-(5): 10,10''-bis(di-p-tolylamino)tri-9,10-anthrylene; [III]-(6): 10-(N-phenyl-N-p-(4-methylphenylvinyl)phenylamino)tri-9,10-anthrylene; [III]-(7): 10,10''-bis(N-phenyl-N-p-(4-methylphenylvinyl)phenylamino)tri-9,10-anthrylene.

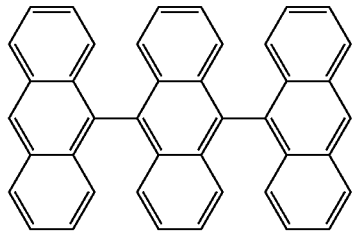

[III]-(3)

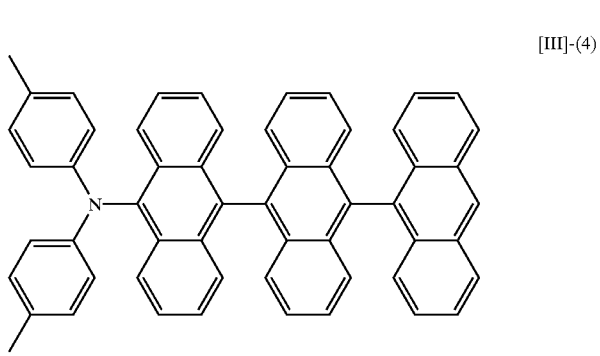

[III]-(4)

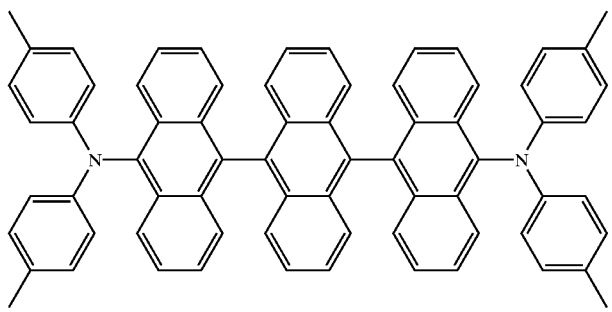

[III]-(5)

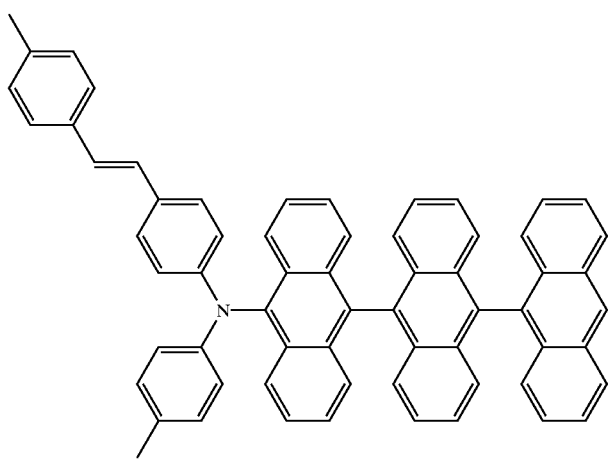

[III]-(6)

[III]-(7)

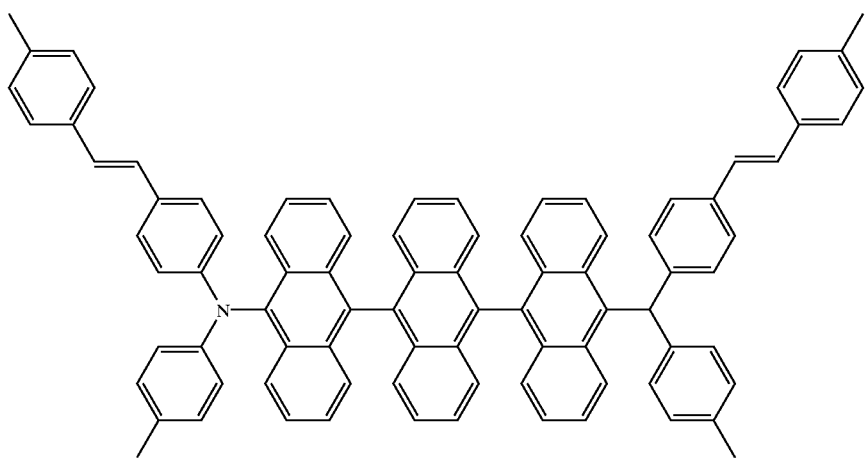

(4) The above particular naphthylanthracene compound [IV] may be represented by general formula

[IV]-(1)

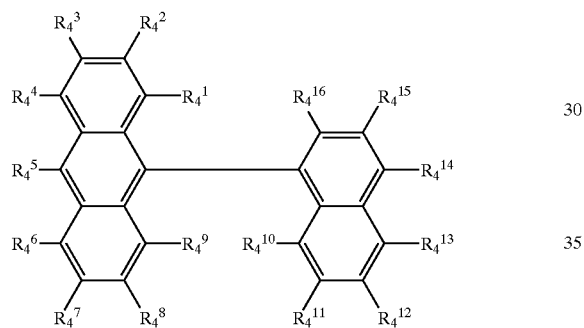

wherein $R_4^1$ to $R_4^{16}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_4^1$ to $R_4^{16}$ may form a ring; or [IV]-(2);

[IV]-(2)

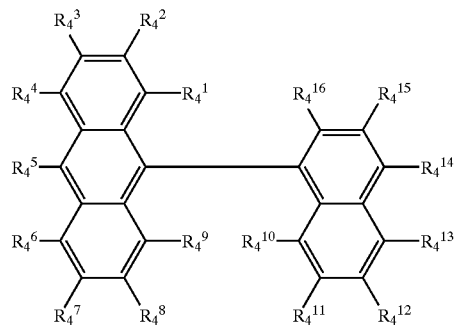

wherein $R_4^1$ to $R_4^{16}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_4^1$ to $R_4^{16}$ may form a ring, although at least one of $R_4^1$ to $R_4^{16}$ is a diarylamino group represented by $-NAr_4^1Ar_4^2$ wherein $Ar_4^1$ and $Ar_4^2$ are independently a substituted or unsubstituted aryl group having 6 to 20 carbon atoms.

In the compound represented by general formula [IV]-(2), at least one of $Ar_4^1$ and $Ar_4^2$ preferably has at least one styryl group as a substituent.

For the above $R_4^1$ to $R_4^{16}$, specific examples of the halogen, the substituted or unsubstituted amino, the substituted or unsubstituted alkyl, the substituted or unsubstituted alkenyl, the substituted or unsubstituted cycloalkyl, the substituted or unsubstituted alkoxy, the substituted or unsubstituted aromatic hydrocarbon, the substituted or unsubstituted aromatic heterocycle, the substituted or unsubstituted aralkyl, the substituted or unsubstituted aryloxy, and the substituted or unsubstituted alkoxycarbonyl, are as described for the above $R_1^1$ to $R_1^{18}$. Examples of the ring formed by two of $R_4^1$ to $R_4^{16}$; of the aryl group having 6 to 20 carbons; and of the styryl group, are also as described for $R_1^1$ to $R_1^8$ for the compounds in [I].

Examples of the naphthylanthracene compounds are, but not limited to, as follows.

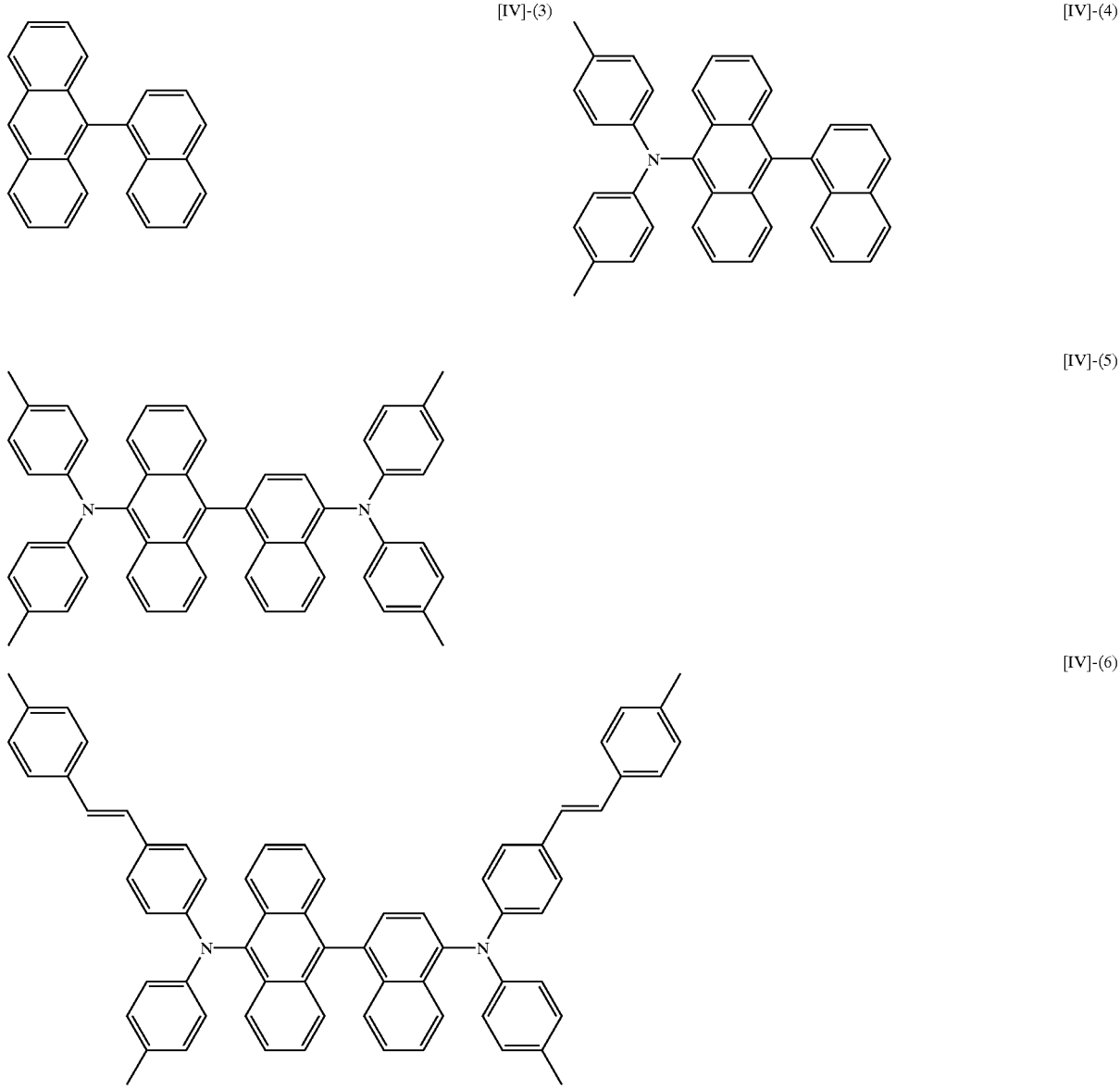

Figure 2:
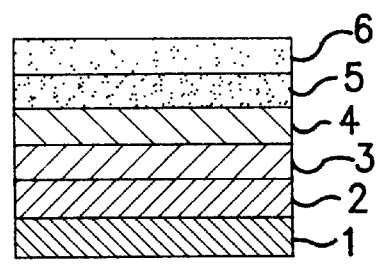
Figure 3:
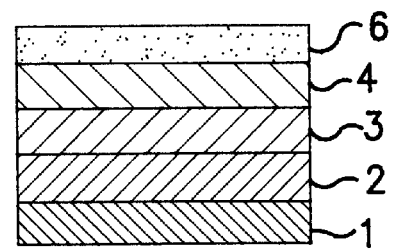
Figure 4:
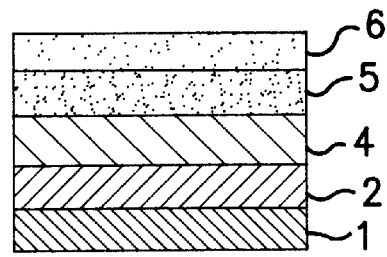

An organic EL device according to this invention has some organic layers between electrodes. For example, it has a structure as shown in FIG. 1 consisting of an anode 2, a luminescent layer 4 and a cathode 6; as shown in FIG. 2 consisting of an anode 2, a hole-transporting layer 3, a luminescent layer 4, an electron-transporting layer 5 and a cathode 6; as shown in FIG. 3 consisting of an anode 2, a hole-transporting layer 3, a luminescent layer 4 and a cathode 6; or as shown in FIG. 4 consisting of an anode 2, a luminescent layer 4, an electron-transporting layer 5 and a cathode 6. In FIGS. 1 to 4, 1 represents a substrate. The above-mentioned compounds can be applied to any of the above organic layers, and can be added as a dopant in another hole-transporting, luminescent or electron-transporting material.

There is no limitation for a hole-transporting material used in this invention, and thus any compound commonly used as a hole-transporting material may be employed. Examples of the hole-transporting material are bis(di(p-tolyl)aminophenyl)-1,1-cyclohexane[01], N,N'-diphenyl-N, N'-bis(3-methylphenyl)-1,1'-biphenyl-4,4'-diamine[02], N,N'-diphenyl-N,N-bis(1-naphthyl)-1,1'-biphenyl)-4,4'-diamine[03] and star-burst type compounds (e.g., [04] to [06]).

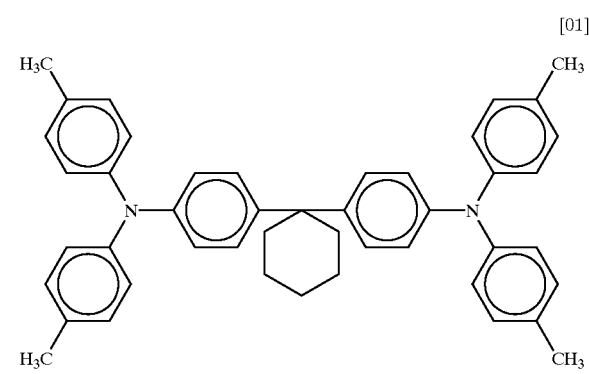

-continued

[02]
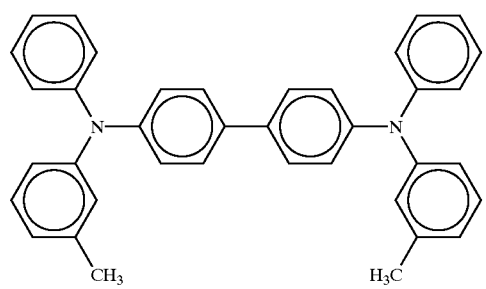

[03]
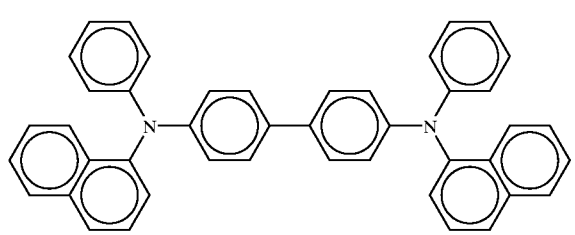

[04]
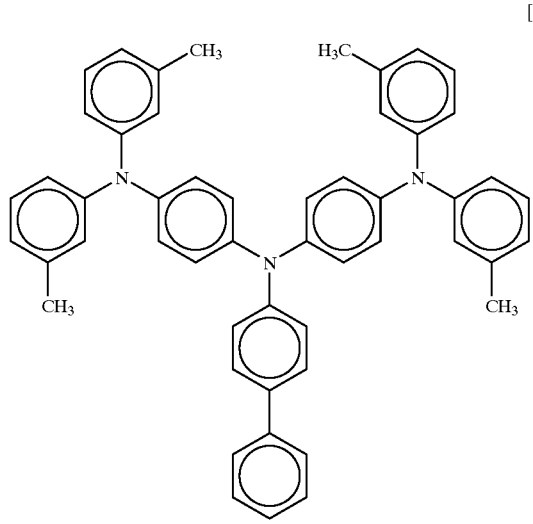

-continued

[05]
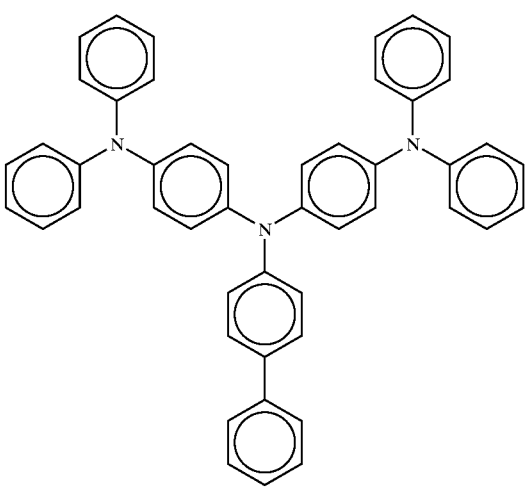

[06]
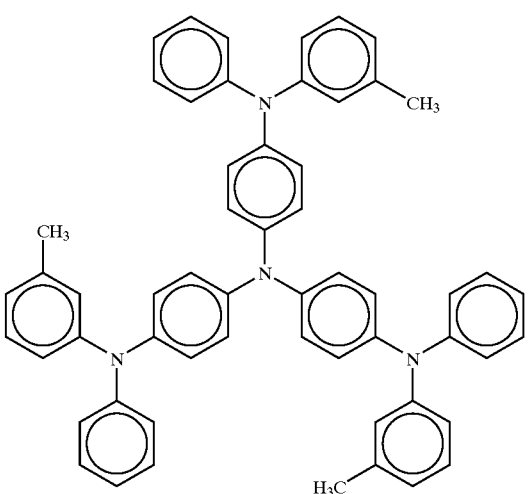

There is no limitation for an electron-transporting material used in this invention, and thus any compound commonly used as an electron-transporting material may be employed. Examples of the electron-transporting material are oxadiazoles such as 2-(4-biphenylyl)-5-(4-t-butylphenyl)-1,3,4-oxadiazole[07] and bis{2-(4-t-butylphenyl)-1,3,4-oxadiazolyl}-m-phenylene[08]; triazoles such as [09] and [10]; and quinolinolic metal complexes such as [11] to [14].

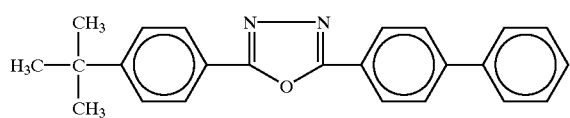
[07]
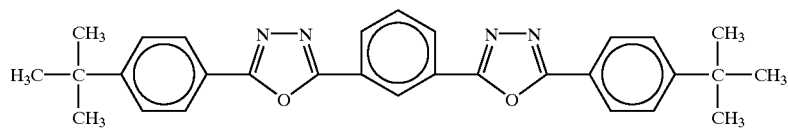
[08]
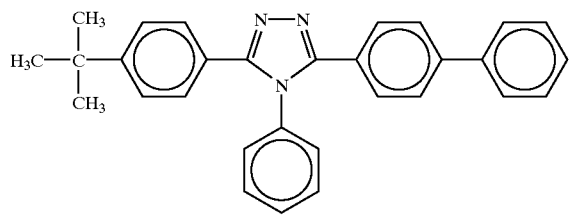
[09]
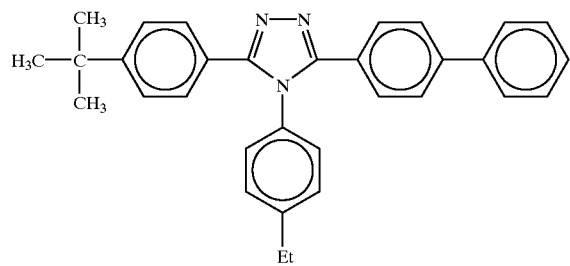
[10]
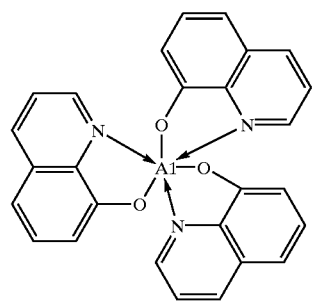
[11]
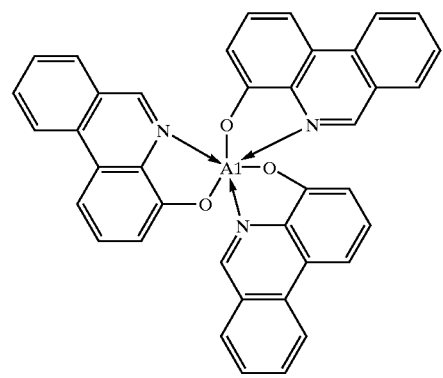
[12]
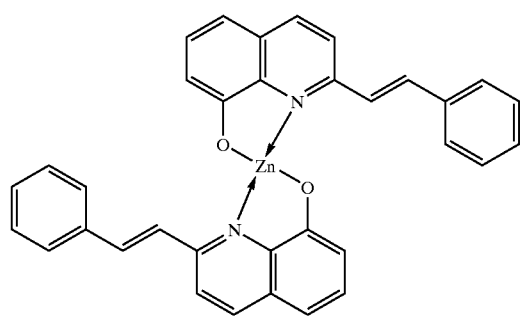
[13]
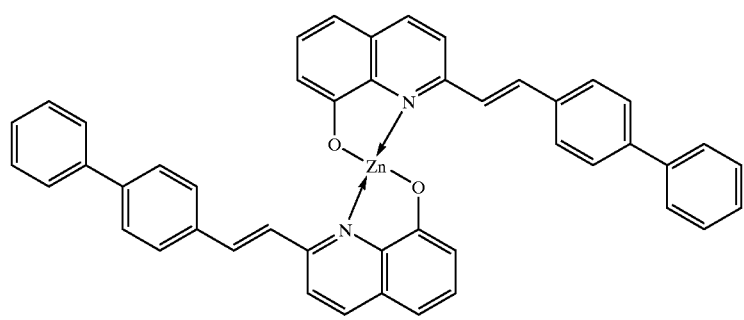
[14]

An anode of an organic EL device injects positive holes into a hole-transporting layer. It is, therefore, effective for the anode to have a work function at least 4.5 eV. Examples of an anode material used in this invention are indium oxide-tin alloy(ITO), stannic oxide(NESA), gold, silver, platinum and copper. Since a cathode injects electrons into an electron-transporting or luminescent layer, it preferably has a lower work function. Examples of a cathode material are, but not limited to, indium, aluminum, magnesium, magnesium-indium alloy, magnesium-aluminum alloy, aluminum-lithium alloy, aluminum-scandium-lithium alloy, and magnesium-tin alloy.

Each layer of an organic EL device according to this invention may be formed by a known process such as, but not limited to, vacuum evaporation and spin coating. An organic thin layer used in an organic EL device according to this invention, which contains any of the above general formulas [I] to [IV], may be formed by a known process such as vacuum evaporation, molecular-beam evaporation (MBE) and application of a solution, e.g., dipping, spin coating, casting, bar coating and roll coating.

There is no limitation for a thickness of each organic layer of an organic EL device according to this invention. However, in general, an excessively thin layer tends to cause defects such as a pin hole, while an excessively thick layer may require higher applied voltage, resulting in a lower efficiency. The thickness is, therefore, preferably several nanometers to 1 μm.

This invention will be specifically described with the following examples, but is not limited to the examples without departing from its spirit and scope.

EXAMPLES

Preparation Example 1

Preparation of Compound [I]-(3), 9,9'-bianthryl

The title compound, 9,9'-bianthryl, was prepared by treating 9-anthrone with magnesium and iodine as usual.

Preparation Example 2

Preparation of Compound [I]-(4), 10-diphenylamino-9,9'-bianthryl

In a flask were placed 35 g of 9,9'-bianthryl, 18.0 g of N-bromosuccinimide and 500 mL of carbon tetrachloride, and the mixture was stirred overnight. The reaction mixture was filtered, the filtrate was passed through a column filled with alumina. Carbon tetrachloride was evaporated from the solution under a reduced pressure, and then the residue was recrystallized from petroleum ether, to give 35 g(yield: 80%) of 10-bromo-9,9'-bianthryl. Then, in a 100 mL three-necked flask were placed 18.3 g of 10-bromo-9,9'-bianthryl, 10 g of diphenylamine, 8.5 g of potassium carbonate, 0.2 g of copper powder and 50 mL of nitrobenzene, and the mixture was stirred at 200° C. for 30 hours. After completion of the reaction, toluene was added to the mixture. The mixture was filtered to remove inorganics. Toluene and nitrobenzene were evaporated under a reduced pressure. The residue was purified by column chromatography on silica gel eluting with a 1:2 mixture of toluene and ligroin, to give 15 g(yield: 60%) of 10-diphenylamino-9,9'-bianthryl.

Preparation Example 3

Preparation of Compound [I]-(5), 10,10'-bis(diphenylamino)-9,9'-bianthryl

In a flask were placed 35 g of 9,9'-bianthryl and 300 mL of carbon tetrachloride, and to the vigorously stirred mixture was slowly added 40 g of bromine under cooling. After addition, the mixture was slowly warmed and then refluxed for 1 hour with stirring. Carbon tetrachloride was evaporated from the reaction mixture under a reduced pressure, the residual solid was extracted with carbon tetrachloride using a Soxhlet extractor. The extract was dried and concentrated to give 42 g(yield 81%) of 10,10'-dibromo-9,9'-bianthryl. Then, in a 100 mL three-necked flask were placed 25 g of 10,10'-dibromo-9,9'-bianthryl, 20 g of diphenylamine, 17 g of potassium carbonate, 0.4 g of copper powder and 80 mL of nitrobenzene, and the mixture was stirred at 200° C. for 30 hours. After completion of the reaction, toluene was added to the mixture. The mixture was filtered to remove inorganics. Toluene and nitrobenzene were evaporated under a reduced pressure. The residue was purified by column chromatography on silica gel eluting with a 1:2 mixture of toluene and ligroin, to give 19 g(yield: 55%) of 10,10'-bis(diphenylamino)-9,9'-bianthryl.

Preparation Example 4

Preparation of Compound [I]-(6), 10-N,N'-di(4-(α,α-dimethylbenzyl)phenyl)amino-9,9'-bianthryl The title compound, 10-N,N'-di(4-(α,α-dimethylbenzyl)phenyl)amino-9,9'-bianthryl (20 g; yield 54%), was prepared as described in Preparation Example 2, except that 10 g of diphenylamine was replaced with 24 g of N,N-di(4-(α,α-dimethylbenzyl)phenyl)amine.

Preparation Example 5

Preparation of Compound [I]-(7), 10,10'-bis(N-phenyl-N-p-styrylphenylamino)-9,9'-bianthryl 10,10'-Bis(p-tolylphenylamino)-9,9'-bianthryl(19 g; yield 54%) was prepared as described in Preparation Example 3, except that 20 g of diphenylamine was replaced with 22 g of p-tolylphenylamine. Then, 7 g of 10,10'-bis(p-tolylphenylamino)-9,9'-bianthryl was dissolved in 50 mL of toluene, to which 3.7 g of phosphorus oxychloride was then added, and the mixture was stirred at room temperature. To the mixture was added dropwise 2.7 g of N-methylformanilide, and the mixture was stirred at 50° C. for 5 hours. After completion of the reaction, the mixture was slowly poured into 100 mL of cold water. The mixture was transferred into a separatory funnel and the toluene layer was washed several times until pH of the washing become neutral. The organic layer was dried over magnesium sulfate and evaporated to give 4.5 g (yield 60%) of 10,10'-bis(N-p-formylphenyl-N-tolylamino)-9,9'-bianthryl. To 50 mL of dimethylsulfoxide were added 2.9 g of diethyl benzylphosphonate and 0.6 g of sodium hydride. To the stirred mixture was added dropwise 4.5 g of 10,10'-bis(N-p-formylphenyl-N-tolylamino)-9,9'-bianthryl in 50 mL of dimethylsulfoxide, and the reaction mixture was stirred at 50° C. for 3 hours. After completion of the reaction, the solution was poured into 50 mL of ice-water. The mixture was neutralized with an acid and extracted with ethyl acetate. After evaporating the solvent under a reduced pressure, the residue was purified by column chromatography on silica gel eluting with chloroform, and the product was recrystallized from ethanol to give 3.8 g (yield 70%) of 10,10'-bis(N-p-styrylphenyl-N-tolylamino)-9,9'-bianthryl.

Preparation Example 6

Preparation of Compound [II]-(6), 3,3'-dimethyl-4,4'-bis(di-p-tolylamino)-1,1'-binaphthyl In a 100 mL three-necked flask were placed 2 g of 3,3'-dimethylnaphthydine, 5.6 g of p-iodotoluene, 0.2 g of copper powder, 2 g of potassium carbonate and 10 mL of nitrobenzene, and the mixture was stirred at 200° C. for 30 hours. After completion of the reaction, toluene was added and the mixture was filtered to remove inorganics. Then, the filtrate was washed with water, dried over magnesium sulfate and evaporated. The residue was purified by column chromatography on silica gel eluting with a mixture of toluene-hexane, to give 2.2 g of 3,3'-dimethyl-4,4'-bis(di-p-tolylamino)-1,1'-binaphthyl.

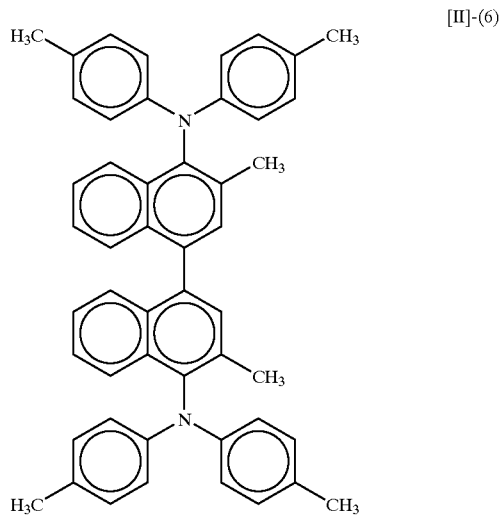

[II]-(6)

This compound belongs to the compound represented by the above general formula [II]-(1).

Preparation Example 7

Preparation of Compound [II]-(7), 3,3'-dimethyl-4, 4'-bis(4-styryldiphenylamino)-1,1'-binaphthyl In a 100 mL three-necked flask were placed 4 g of 3,3'-dimethylnaphthydine, 10.4 g of p-iodobenzene, 0.4 g of copper powder, 4.0 g of potassium carbonate and 15 mL of nitrobenzene, and the mixture was stirred at 200° C. for 30 hours. After completion of the reaction, toluene was added and the mixture was filtered to remove inorganics. Then, the filtrate was washed with water, dried over magnesium sulfate and evaporated. The residue was purified by column chromatography on silica gel eluting with a mixture of toluene-hexane, to give 4 g of 3,3'-dimethyl-4,4'-bis (diphenylamino)-1,1'-binaphthyl.

In a 50 mL three-necked flask were placed 2 g of 3,3'-dimethyl-4,4'-bis(diphenylamino)-1,1'-binaphthyl, 10 mL of toluene and 1.1 g of phosphorus oxychloride. To the stirred mixture was slowly added dropwise 1.0 g of N-methylformanilide, and the mixture was stirred at room temperature for 1 hour and at 50° C. for 4 hours. After completion of the reaction, the mixture was poured into cold water and extracted with toluene. The toluene extract was washed with water, dried over magnesium sulfate and evaporated. The residue was purified by column chromatography on silica gel eluting with a mixture of toluene and hexane, to give 1.5 g of 3,3'-dimethyl-4,4'-bis(4-formyldiphenylamino)-1,1'-binaphthyl.

Then, in a 50 mL three-necked flask were placed 1.4 g of diethyl benzylphosphonate, 0.2 g of sodium hydride and 10 mL of dimethylsulfoxide. To the stirred mixture was slowly added dropwise 1 g of 3,3'-dimethyl-4,4'-bis(4-formyldiphenylamino)-1,1'-binaphthyl in 5 mL of dimethylsulfoxide, and the mixture was stirred at room temperature for 1 hour and at 40° C. for 5 hours. After completion of the reaction, the solution was poured into water and extracted with toluene. The toluene layer was dried over magnesium sulfate and evaporated. The residue was purified by column chromatography on silica gel eluting with a mixture of toluene and ligroin, to give 3,3'-dimethyl-4,4'-bis(4-styryldiphenylamino)-1,1'-binaphthyl.

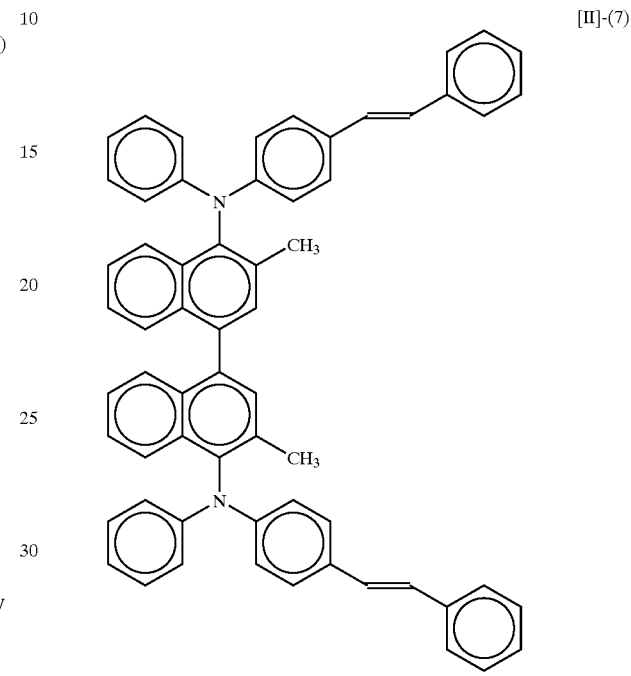

[II]-(7)

This compound belongs to the compound represented by the above general formula [II]-(2).

Preparation Example 8

Preparation of Compound [III]-(3), tri-9,10-anthrylene

9-Bromoanthracene was reacted with lithium to generate 9-lithioanthracene, which was then reacted with anthraquinone.

Then, the product was reduced with hydrogen iodide and phosphinic acid to be aromatized, and was purified as usual, to give the desired tri-9,10-anthrylene.

Preparation Example 9

Preparation of Compound [III]-(4), 10-di-p-tolylaminotri-9,10-anthrylene

In a flask were placed 53 g of tri-9,10-anthrylene obtained as described in Preparation Example 8 and 18 g of N-bromosuccinimide in chloroform, and the mixture was stirred overnight.

The reaction mixture was washed with water. The organic layer was dried and as usual, purified to give 10-bromotri-9,10-anthrylene.

In a three-necked flask were placed 30 g of 10-bromotri-9,10-anthrylene, 9 g of di-p-tolylamine, 3.5 g of potassium carbonate and 1.5 g of copper powder in nitrobenzene, and the mixture was stirred at 200° C. for 30 hours.

After completion of the reaction, toluene and chloroform were added and the mixture was filtered to remove inorganics. Then, toluene, chloroform and nitrobenzene were evaporated under a reduced pressure, and the residue was purified as usual, to give the desired 10-di-p-tolylaminotri-9,10-anthrylene.

Preparation Example 10

Preparation of Compound [III]-(5), 10,10"-bis(di-p-tolylamino)tri-9,10-anthrylene In a flask were placed 53 g of tri-9,10-anthrylene obtained as described in Preparation Example 8 and 36 g of N-bromosuccinimide in chloroform, and the mixture was stirred overnight.

The reaction mixture was washed with water. The organic layer was dried and as usual, purified to give 10,10"-dibromotri-9,10-anthrylene.

In a three-necked flask were placed 35 g of 10,10"-dibromotri-9,10-anthrylene, 18 g of di-p-tolylamine, 7 g of potassium carbonate and 3 g of copper powder in nitrobenzene, and the mixture was stirred at 200° C. for 30 hours.

After completion of the reaction, toluene and chloroform were added and the mixture was filtered to remove inorganics. Then, toluene, chloroform and nitrobenzene were evaporated under a reduced pressure, and the residue was purified as usual, to give the desired 10,10"-bis(di-p-tolylamino)tri-9,10-anthrylene.

Preparation Example 11

Preparation of Compound [III]-(6), 10-(N-phenyl-N-p-(4-methylphenylvinyl)phenylamino)tri-9,10-anthrylene 10-(N-phenyl-N-p-tolylamino)tri-9,10-anthrylene was prepared as described in Preparation Example 9, except that 9 g of di-p-tolylamine was replaced with 8.5 g of N-phenyl-N-p-tolylamine.

Then, 10-(N-phenyl-N-p-tolylamino)tri-9,10-anthrylene was dissolved in toluene, to which phosphorus oxychloride was then added, and the mixture was stirred at room temperature. To the mixture was added dropwise N-methylformanilide, and the mixture was stirred at 50° C. for 5 hours.

After completion of the reaction, the mixture was slowly poured into cold water. The mixture was transferred into a separatory funnel and the toluene layer was washed with water several times until pH of the washing become neutral. The organic layer was dried over magnesium sulfate and evaporated to give 10-(N-formylphenyl-N-p-tolylamino)tri-9,10-anthrylene.

To dimethylsulfoxide were added diethyl 4-methylbenzylphosphonate and sodium hydride. To the stirred mixture was added dropwise 10-(N-formylphenyl-N-p-tolylamino)tri-9,10-anthrylene in dimethylsulfoxide, and the reaction mixture was stirred at 50° C. for 3 hours.

After completion of the reaction, the solution was poured into ice-water. The mixture was neutralized with an acid and extracted with ethyl acetate. After evaporating the solvent under a reduced pressure, the residue was purified as usual to give the desired 10-(N-phenyl-N-p-(4-methylphenylvinyl)phenylamino)tri-9,10-anthrylene.

Preparation Example 12

Preparation of Compound [III]-(7), 10,10"-bis(N-phenyl-N-p-(4-methylphenylvinyl)phenylamino)tri-9,10-anthrylene 10,10"-bis(N-phenyl-N-p-tolylamino)tri-9,10-anthrylene was prepared as described in Preparation Example 10, except that 18 g of di-p-tolylamine was replaced with 17 g of N-phenyl-N-p-tolylamine.

Then, 10,10"-bis(N-phenyl-N-p-tolylamino)tri-9,10-anthrylene was dissolved in toluene, to which phosphorus oxychloride was then added, and the mixture was stirred at room temperature. To the mixture was added dropwise N-methylformanilide, and the mixture was stirred at 50° C. for 5 hours.

After completion of the reaction, the mixture was slowly poured into cold water. The mixture was transferred into a separatory funnel and the toluene layer was washed with water several times until pH of the washing become neutral. The organic layer was dried over magnesium sulfate and evaporated to give 10,10"-bis(N-formylphenyl-N-p-tolylamino)tri-9,10-anthrylene.

To dimethylsulfoxide were added diethyl 4-methylbenzylphosphonate and sodium hydride. To the stirred mixture was added dropwise 10,10"-bis(N-formylphenyl-N-p-tolylamino)tri-9,10-anthrylene in dimethylsulfoxide, and the reaction mixture was stirred at 50° C. for 3 hours.

After completion of the reaction, the solution was poured into ice-water. The mixture was neutralized with an acid and extracted with ethyl acetate. After evaporating the solvent under a reduced pressure, the residue was purified as usual to give the desired 10,10"-bis(N-phenyl-N-p-(4-methylphenylvinyl)phenylamino)tri-9,10-anthrylene.

Preparation Example 13

Preparation of Compound [IV]-(3), 9-α-naphthylanthracene

A Grignard reagent was prepared from 1-bromonaphthalene and magnesium in diethyl ether under an inert atmosphere. The reagent was reacted with 9-anthrone. The reaction was quenched with hydrochloric acid, and the mixture was purified as usual, to give the desired 9-α-naphthylanthracene.

Preparation Example 14

Preparation of Compound [IV]-(4), 10-di-p-tolylamino-9-α-naphthylanthracene

In a flask were 9-α-naphthylanthracene and an equivalent amount of N-bromosuccinimide, and the reaction mixture was stirred overnight and then filtered. The filtrate was passed through a column filled with alumina. Chloroform was evaporated from the solution under a reduced pressure, and then the residue was recrystallized from petroleum ether, to give 10-chloro-9-α-naphthylanthracene. Then, in a three-necked flask were placed 10-chloro-9-α-naphthylanthracene, an equivalent amount of di-p-tolylamine, an equivalent amount of potassium carbonate, copper powder and nitrobenzene, and the mixture was stirred at 200° C. for 30 hours. After completion of the reaction, toluene was added to the mixture. The mixture was filtered to remove inorganics. Toluene and nitrobenzene were evaporated under a reduced pressure. The residue was purified by column chromatography on silica gel eluting with a 1:2 mixture of toluene and ligroin, to give 10-di-p-tolylamino-9-α-naphthylanthracene.

Preparation Example 15

Preparation of Compound [IV]-(5), 10-di-p-tolylamino-9-(4-di-p-tolylamino-1-naphthyl)anthracene The title compound, 10-di-p-tolylamino-9-(4-di-p-tolylamino-1-naphthyl)anthracene, was prepared as described in Preparation Example 14, except that both N-bromosuccinimide and di-p-tolylamine were used in two equivalent amount.

Preparation Example 16

Preparation of Compound [IV]-(6), 10-N-(p-tolylvinylphenyl)-N-p-tolylamino-9-(4-N-(p-tolylvinylphenyl)-N-p-tolylamino-1-naphthyl) anthracene 10-N-Phenyl-N-p-tolylamino-9-(4-N-phenyl-N-p-tolylamino-1-naphthyl)anthracene was prepared as described in Preparation Example 16, except that di-p-tolylamine was replaced with p-tolylphenylamine. In toluene was dissolved 10-N-Phenyl-N-p-tolylamino-9-(4-N-phenyl-N-p-tolylamino-1-naphthyl)anthracene. Phosphorus oxychloride was added to the solution and the mixture was then stirred at room temperature. To the stirred mixture was added dropwise N-methylformanilide, and the mixture was stirred at 50° C. for 5 hours. After completion of the reaction, the mixture was slowly poured into cold water. The mixture was transferred into a separatory funnel. The toluene layer was washed several times with water until pH of the washing became neutral, dried over magnesium sulfate and evaporated, to give 10-N-(p-formylphenyl)-N-p-tolylamino-9-(4-N-(p-formylphenyl)-N-p-tolylamino-1-naphthyl) anthracene. Then, to dimethylsulfoxide was added diethyl 4-methylbenzylphosphonate and sodium hydride. To the stirred mixture was added dropwise 10-N-(p-formylphenyl)-N-p-tolylamino-9-(4-N-(p-formylphenyl)-N-p-tolylamino-1-naphthyl)anthracene in dimethylsulfoxide, and then the mixture was stirred at 50° C. for 3 hours. After completion of the reaction, the reaction solution was poured into ice-water and extracted with ethyl acetate. After evaporating the solvent under a reduced pressure, the residue was purified by column chromatography on silica gel eluting with chloroform, and the product was recrystallized from ethanol, to give 10-N-(p-tolylvinylphenyl)-N-p-tolylamino-9-(4-N-(p-tolylvinylphenyl)-N-p-tolylamino-1-naphthyl) anthracene.

The followings are examples where a compound in [I] is used as a luminescent layer (Examples 1 to 11); a mixture layer of the compound and a hole-transporting material as a luminescent layer (Examples 12 to 14); a mixture layer of the compound and an electron-transporting material as a luminescent layer (Examples 15 and 16), the compound as a hole-transporting layer (Examples 17 to 21) or the compound as an electron-transporting layer (Examples 22 to 26).

Example 1

FIG. 1 shows the cross section of the device in this example. A procedure for preparing an organic EL device of this invention will be described. The device consists of an anode 2/a luminescent layer 4/a cathode 6. On a glass substrate 1, ITO was deposited as an anode 2 by spattering, with a sheet resistance of 20 Ω/□. On the anode 2, Compound [I]-(3) was deposited to 40 nm thick as a luminescent layer 4, by vacuum evaporation. Then, magnesium-silver alloy as a cathode 6 was deposited to 200 nm thick, by vacuum evaporation, to give an organic EL device. Applying 5 V DC to the device generated a luminescence of 100 cd/m$^2$.

Example 2

An organic EL device was prepared as described in Example 1, except using Compound [I]-(4) as a luminescent material. Applying 5 V DC to the device generated a luminescence of 200 cd/m$^2$.

Example 3

An organic EL device was prepared as described in Example 1, except using Compound [I]-(5) as a luminescent material. Applying 5 V DC to the device generated a luminescence of 250 cd/m$^2$.

Example 4

An organic EL device was prepared as described in Example 1, except using Compound [I]-(6) as a luminescent material. Applying 5 V DC to the device generated a luminescence of 400 cd/m$^2$.

Example 5

An organic EL device was prepared as described in Example 1, except using Compound [I]-(7) as a luminescent material. Applying 5 V DC to the device generated a luminescence of 500 cd/m$^2$.

Example 6

On a glass substrate, ITO was deposited as an anode by spattering, with a sheet resistance of 20 Ω/□. On the anode was formed a luminescent layer 40 nm thick, by spin coating with a solution of Compound [I]-(5) in chloroform. Then, magnesium-silver alloy as a cathode was deposited to 200 nm thick, by vacuum evaporation, to give an organic EL device. Applying 5 V DC to the device generated a luminescence of 120 cd/m$^2$.

Example 7

FIG. 2 shows the cross section of the device in this example. The device consists of an anode 2/a hole-transporting layer 3/a luminescent layer 4/an electron-transporting layer 5/a cathode 6. On a glass substrate, ITO was deposited as an anode by spattering, with a sheet resistance of 20 Ω/□. On the anode was deposited N,N'-diphenyl-N,N'-bis(3-methylphenyl)-[1,1'-biphenyl]-4,4'-diamine[02] 50 nm thick as a hole-transporting layer by vacuum evaporation. Then, Compound [I]-(3) was deposited to 40 nm thick as a luminescent layer, by vacuum evaporation. Then, 2-(4-biphenyl)-5-(4-t-butylphenyl)-1,3,4-oxadiazole[07] was deposited to 20 nm thick as an electron-transporting layer, by vacuum evaporation. Then, magnesium-silver alloy as a cathode was deposited to 200 nm thick, by vacuum evaporation, to give an organic EL device. Applying 10 V DC to the device generated a luminescence of 1000 cd/m$^2$.

Example 8

An organic EL device was prepared as described in Example 7, except using Compound [I]-(5) as a luminescent material. Applying 10 V DC to the device generated a luminescence of 2000 cd/m$^2$.

Example 9

An organic EL device was prepared as described in Example 7, except using N,N'-diphenyl-N,N-bis(1-naphthyl)-1,1'-biphenyl)-4,4'-diamine[03] as a hole-transporting layer and bis{2-(4-t-butylphenyl)-1,3,4-oxadiazole}-m-phenylene[08] as an electron-transporting layer. Applying 10 V DC to the device generated a luminescence of 1500 cd/m$^2$.

Example 10

An organic EL device was prepared as described in Example 7, except using Compound [04] as a hole-transporting layer, Compound [I]-(5) as a luminescent layer and Compound [9] as an electron-transporting layer. Applying 14 V DC to the device generated a luminescence of 2000 cd/m$^2$.

Example 11

An organic EL device was prepared as described in Example 7, except using Compound [05] as a hole-transporting layer, Compound [I]-(7) as a luminescent layer and Compound [12] as an electron-transporting layer. Applying 10 V DC to the device generated a luminescence of 2600 cd/m$^2$.

Example 12

FIG. 4 shows the cross section of the device in this example. The device consists of an anode/a luminescent layer/an electron-transporting layer/a cathode. On a glass substrate, ITO was deposited as an anode by spattering, with a sheet resistance of 20 Ω/□. On the anode was co-deposited in vacuo N,N'-diphenyl-N,N'-bis(1-naphthyl)-1,1'-biphenyl)-4,4'-diamine[03] and Compound [I]-(3) (1:10 by weight) 50 nm thick as a luminescent layer. Then, Compound [9] was deposited to 50 nm thick as an electron-transporting layer, by vacuum evaporation. Then, magnesium-silver alloy as a cathode was deposited to 200 nm thick, to give an organic EL device. Applying 10 V DC to the device generated a luminescence of 1200 cd/m$^2$.

Example 13

An organic EL device was prepared as described in Example 12, except using Compound [I]-(5) in place of Compound [I]-(3). Applying 10 V DC to the device generated a luminescence of 2100 cd/m$^2$.

Example 14

On a glass substrate, ITO was deposited as an anode by spattering, with a sheet resistance of 20 Ω/□. On the anode was formed a luminescent layer 40 nm thick, by spin coating with a solution of Compound [I]-(5) and N,N'-diphenyl-N, N'-bis(1-naphthyl)-1,1'-biphenyl)-4,4'-diamine[03] (1:10 molar ratio) in chloroform. Then, Compound [10] was deposited to 50 nm thick as an electron-transporting layer, by vacuum evaporation. Then, magnesium-silver alloy as a cathode was deposited to 200 nm thick, by vacuum evaporation, to give an organic EL device. Applying 10 V DC to the device generated a luminescence of 1000 cd/m$^2$.

Example 15

FIG. 3 shows the cross section of the device in this example. The device consists of an anode/a hole-transporting layer/a luminescent layer/a cathode. On a glass substrate, ITO was deposited as an anode by spattering, with a sheet resistance of 20 Ω/□. On the anode was deposited N,N'-diphenyl-N,N'-bis(1-naphthyl)-1,1'-biphenyl)-4,4'-diamine[03] 50 nm thick as a hole-transporting layer, by vacuum evaporation. Then, Compounds [11] and [I]-(3) (20:1 by weight) were deposited to 50 nm thick as a luminescent layer, by vacuum evaporation. Then, magnesium-silver alloy as a cathode was deposited to 200 nm thick, to give an organic EL device. Applying 10 V DC to the device generated a luminescence of 1300 cd/m$^2$.

Example 16

An organic EL device was prepared as described in Example 15, except co-depositing in vacuo Compounds [11] and [I]-(5) (20:1 by weight) as a luminescent layer. Applying 10 V DC to the device generated a luminescence of 2200 cd/m$^2$.

Example 17

An organic EL device was prepared as described in Example 15, except using N,N'-diphenyl-N,N'-bis(3-methylphenyl)-[1,1'-biphenyl]-4,4'-diamine[02] as a hole-transporting layer and co-depositing in vacuo Compounds [13] and [I]-(7) (20:1 by weight) as a luminescent layer. Applying 10 V DC to the device generated a luminescence of 2500 cd/m$^2$.

Example 18

An organic EL device was prepared as described in Example 7, except using Compound [I]-(4) as a hole-transporting layer and Compound [13] as a luminescent layer. Applying 10 V DC to the device generated a luminescence of 800 cd/m$^2$.

Example 19

An organic EL device was prepared as described in Example 18, except using Compound [I]-(5) as a hole-transporting layer. Applying 10 V DC to the device generated a luminescence of 1200 cd/m$^2$.

Example 20

An organic EL device was prepared as described in Example 18, except using Compound [I]-(6) as a hole-transporting layer. Applying 10 V DC to the device generated a luminescence of 1300 cd/m$^2$.

Example 21

An organic EL device was prepared as described in Example 18, except using Compound [I]-(7) as a hole-transporting layer. Applying 10 V DC to the device generated a luminescence of 1500 cd/m$^2$.

Example 22

An organic EL device was prepared as described in Example 7, except using N,N'-diphenyl-bis(1-naphthyl)-(1, 1'-biphenyl)-4,4'-diamine[03] as a hole-transporting layer, Compound [13] as a luminescent layer and Compound [I]-(3) as an electron-transporting layer. Applying 10 V DC to the device generated a luminescence of 1000 cd/m$^2$.

Example 23

An organic EL device was prepared as described in Example 22, except using Compound [I]-(4) as an electron-transporting layer. Applying 10 V DC to the device generated a luminescence of 800 cd/m$^2$.

Example 24

An organic EL device was prepared as described in Example 22, except using Compound [I]-(5) as an electron-transporting layer. Applying 10 V DC to the device generated a luminescence of 500 cd/m$^2$.

Example 25

An organic EL device was prepared as described in Example 22, except using Compound [I]-(6) as an electron-transporting layer. Applying 10 V DC to the device generated a luminescence of 700 cd/m².

Example 26

An organic EL device was prepared as described in Example 22, except using Compound [I]-(7) as an electron-transporting layer. Applying 10 V DC to the device generated a luminescence of 400 cd/m².

The followings are examples where a compound in [II] is used as a luminescent layer (Examples 27 to 37); a mixture layer of the compound and a hole-transporting material as a luminescent layer (Examples 38 to 40); a mixture layer of the compound and an electron-transporting material as a luminescent layer (Examples 41 and 43), the compound as a hole-transporting layer (Examples 44 to 46) or the compound as an electron-transporting layer (Examples 47 to 51).

Example 27

The cross section of the organic thin-layer EL device in this example is shown in FIG. 1, whose preparation procedure is as described in Example 1. The EL device consists of an anode 2/a luminescent layer 4/a cathode 6. On a glass substrate 1, ITO was deposited as an anode 2 by spattering, with a sheet resistance of 20 Ω/□. On the anode 2, a thin layer of 4-(di-p-tolylamino)-1,1'-binaphthyl([II]-(8)) was deposited to 40 nm thick as a luminescent layer 4, by vacuum evaporation.

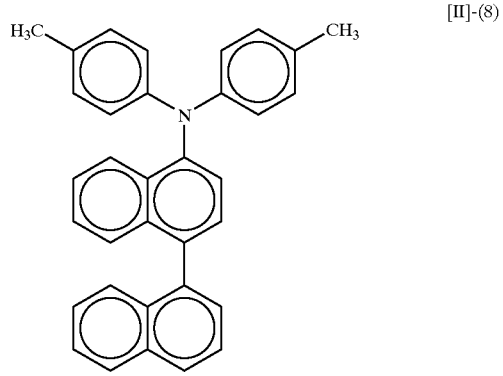

[II]-(8)

Then, magnesium-silver alloy as a cathode 6 was deposited to 200 nm thick, by vacuum evaporation, to give an organic EL device. Applying 5 V DC to the device generated a luminescence of 150 cd/m².

Example 28

A similar organic EL device was prepared as described in Example 27, except using 3,3'-dimethyl-4,4'-bis(4-methyldiphenylamino)-1,1'-binaphthyl([II]-(9)) as a luminescent material.

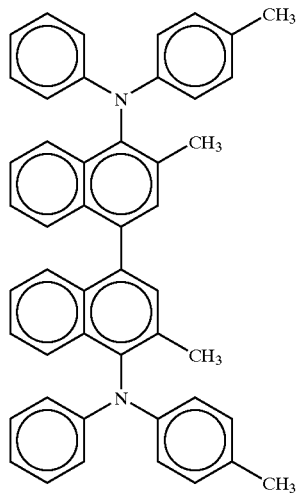

[II]-(9)

Applying 5 V DC to the device generated a luminescence of 250 cd/m².

Example 29

A similar organic EL device was prepared as described in Example 27, except using 3,3'-dimethyl-4,4'-bis(di-p-tolylamino)-1,1'-binaphthyl([II]-(6)) as a luminescent material. Applying 5 V DC to the device generated a luminescence of 250 cd/m².

Example 30

A similar organic EL device was prepared as described in Example 27, except using 3,3'-dimethyl-4,4'-bis(phenyl-p-β-styrylphenylamino)-1,1'-binaphthyl([II]-(7)) as a luminescent material. Applying 5 V DC to the device generated a luminescence of 480 cd/m².

Example 31

A similar organic EL device was prepared as described in Example 27, except using Compound [II]-(5) as a luminescent material. Applying 5 V DC to the device generated a luminescence of 650 cd/m².

Example 32

On a glass substrate, ITO was deposited as an anode by spattering, with a sheet resistance of 20 Ω/□. On the anode was formed a luminescent layer 40 nm thick, by spin coating with a solution of 4,4'-bis(diphenylamino)-1,1'-binaphthyl ([II]-(3)) in chloroform.

[II]-(10)

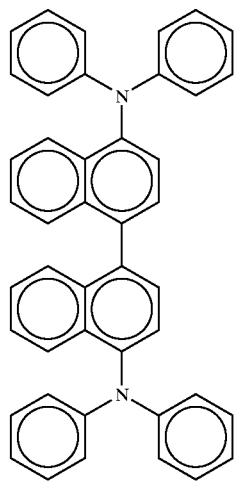

Then, magnesium-silver alloy as a cathode was deposited to 200 nm thick, by vacuum evaporation, to give an organic EL device as shown in FIG. 1. Applying 5 V DC to the device generated a luminescence of 120 cd/m².

Example 33

The device of this example has the cross section shown in FIG. 2 and described in Example 7. The EL device consists of an anode 2/a hole-transporting layer 3/a luminescent layer 4/an electron-transporting layer 5/a cathode 6. On a glass substrate 1, ITO was deposited as an anode 2 by spattering, with a sheet resistance of 20 Ω/□. On the anode was deposited a thin layer of N,N'-diphenyl-N,N'-bis(3-methylphenyl)-[1,1'-biphenyl]-4,4'-diamine[02] 50 nm thick as a hole-transporting layer 3. Then, a thin layer of 3,3'-dimethyl-4,4'-bis(4-methyldiphenylamino)-1,1'-binaphthyl ([II]-(9)) was deposited to 40 nm thick as a luminescent layer 4, by vacuum evaporation. Then, a thin layer of 2-(4-biphenyl)-5-(4-t-butylphenyl)-1,3,4-oxadiazole[07] was deposited to 20 nm thick as an electron-transporting layer 5, by vacuum evaporation. Finally, magnesium-silver alloy as a cathode 6 was deposited to 200 nm thick, by vacuum evaporation, to give an organic EL device. Applying 10 V DC to the device generated a luminescence of 1200 cd/m².

Example 34

An organic EL device as shown in FIG. 2 was prepared as described in Example 7, except using Compound [II]-(7) as a luminescent material. Applying 10 V DC to the device generated a luminescence of 2500 cd/m².

Example 35

An organic EL device as shown in FIG. 2 was prepared as described in Example 33, except using N,N'-diphenyl-N,N-bis(1-naphthyl)-1,1'-biphenyl)-4,4'-diamine[03] as a hole-transporting material and bis{2-(4-t-butylphenyl)-1,3,4-oxadiazole}-m-phenylene[08] as an electron-transporting material. Applying 10 V DC to the device generated a luminescence of 1600 cd/m².

Example 36

An organic EL device as shown in FIG. 2 was prepared as described in Example 33, except using Compound [04] as a hole-transporting material, Compound [II]-(7) as a luminescent material and Compound [11] as an electron-transporting material. Applying 10 V DC to the device generated a luminescence of 2700 cd/m².

Example 37

An organic EL device as shown in FIG. 2 was prepared as described in Example 33, except using Compound [05] as a hole-transporting material, Compound [II]-(5) as a luminescent material and Compound [12] as an electron-transporting material. Applying 10 V DC to the device generated a luminescence of 3200 cd/m².

Example 38

The EL device of this example has a cross section as shown in FIG. 4. The device consists of an anode 2/a luminescent layer 4/an electron-transporting layer 5/a cathode 6. On a glass substrate 1, ITO was deposited as an anode 2 by spattering, with a sheet resistance of 20 Ω/cm/cm. On the anode was co-deposited in vacuo a thin layer of N,N'-diphenyl-N,N'-bis(1-naphthyl)-1,1'-biphenyl-4,4'-diamine [03] and 3,3'-dimethyl-4,4'-bis(4-methyldiphenylamino)-1,1'-binaphthyl([II]-(9)) (1:10 ratio by weight) 50 nm thick as a luminescent layer 4. Then, a thin layer of Compound [09] was deposited to 50 nm thick as an electron-transporting layer 5, by vacuum evaporation. Then, a thin layer of magnesium-silver alloy as a cathode 6 was deposited to 200 nm thick, to give an EL device. Applying 10 V DC to the device generated a luminescence of 1200 cd/m².

Example 39

An organic EL device as shown in FIG. 4 was prepared as described in Example 38, except using 3,3'-dimethyl-4,4'-bis(4-β-styryldiphenylamino)-1,1'-binaphthyl([II]-(6)) in place of 3,3'-dimethyl-4,4'-bis(4-methyldiphenylamino)-1,1'-binaphthyl([II]-(9)). Applying 10 V DC to the device generated a luminescence of 2100 cd/m².

Example 40

On a glass substrate, ITO was deposited as an anode by spattering, with a sheet resistance of 20 Ω/□. On the anode was formed a luminescent layer 40 nm thick, by spin coating with a solution of 3,3'-dimethyl-4,4'-bis(4-β-styryldiphenylamino)-1,1'-binaphthyl([II]-(7)) and N,N'-diphenyl-N,N'-bis(1-naphthyl)-1,1'-biphenyl)-4,4'-diamine [03] (1:10 molar ratio) in chloroform. Then, Compound [10] was deposited to 50 nm thick as an electron-transporting layer, by vacuum evaporation. Then, magnesium-silver alloy as a cathode was deposited to 200 nm thick, by vacuum evaporation, to give an organic EL device as shown in FIG. 4. Applying 10 V DC to the device generated a luminescence of 1100 cd/m².

Example 41

This example will describe a device as shown in FIG. 3. On a glass substrate 1, ITO was deposited as an anode 2 by spattering, with a sheet resistance of 20 Ω/cm/cm. On the anode was deposited a thin layer of N,N'-diphenyl-N,N'-bis(1-naphthyl)-1,1'-biphenyl)-4,4'-diamine[03] 50 nm thick as a hole-transporting layer 3, by vacuum evaporation. Then, a thin layer of Compound [11] and 3,3'-dimethyl-4,4'-bis(4-methyldiphenylamino)-1,1'-binaphthyl([II]-(9)) (20:1 by weight) were deposited to 50 nm thick as a luminescent layer 4, by vacuum evaporation. Then, magnesium-silver alloy as a cathode 6 was deposited to 200 nm thick, to give an EL device. Applying 10 V DC to the device generated a luminescence of 1500 cd/m$^2$.

Example 42

An organic EL device as shown in FIG. 3 was prepared as described in Example 41, except co-depositing in vacuo Compound [11] and 3,3'-dimethyl-4,4'-bis(4-β-styryldiphenylamino)-1,1'-binaphthyl([II]-(7)) (20:1 by weight) as a luminescent layer. Applying 10 V DC to the device generated a luminescence of 2000 cd/m$^2$.

Example 43

An organic EL device as shown FIG. 3 was prepared as described in Example 41, except using N,N'-diphenyl-N,N'-bis(3-methylphenyl)-[1,1'-biphenyl]-4,4'-diamine[02] as a hole-transporting material and co-depositing in vacuo Compounds [13] and [II]-(5) (20:1 by weight) as a luminescent layer. Applying 10 V DC to the device generated a luminescence of 2500 cd/m$^2$.

Example 44

An organic EL device as shown in FIG. 3 was prepared as described in Example 33, except using 3,3'-dimethyl-4,4'-bis(4-β-styryldiphenylamino)-1,1'-binaphthyl([II]-(7)) as a hole-transporting material and Compound [13] as a luminescent layer. Applying 10 V DC to the device generated a luminescence of 1200 cd/m$^2$.

Example 45

An organic EL device as shown in FIG. 3 was prepared as described in Example 44, except using Compound [II]-(4) as a hole-transporting material. Applying 10 V DC to the device generated a luminescence of 1300 cd/m$^2$.

Example 46

An organic EL device as shown in FIG. 3 was prepared as described in Example 44, except using Compound [II]-(5) as a hole-transporting material. Applying 10 V DC to the device generated a luminescence of 1500 cd/m$^2$.

Example 47

An organic EL device as shown in FIG. 3 was prepared as described in Example 33, except using N,N'-diphenyl-N,N'-bis(1-naphthyl)-1,1'-biphenyl-4,4'-diamine[03] as a hole-transporting material, Compound [13] as a luminescent material and 3,3'-dimethyl-4,4'-bis(4-methyldiphenylamino)-1,1'-binaphthyl([II]-(9)) as an electron-transporting material. Applying 10 V DC to the device generated a luminescence of 1000 cd/m$^2$.

Example 48

An organic EL device as shown in FIG. 3 was prepared as described in Example 47, except using 3,3'-dimethyl-4,4'-bis(di-p-tolylamino)-1,1'-binaphthyl([II]-(6)) as an electron-transporting material. Applying 10 V DC to the device generated a luminescence of 800 cd/m$^2$.

Example 49

An organic EL device as shown in FIG. 3 was prepared as described in Example 47, except using 3,3'-dimethyl-4,4'-bis(4-β-styryldiphenylamino)-1,1'-binaphthyl([II]-(7)) as an electron-transporting material. Applying 10 V DC to the device generated a luminescence of 500 cd/m$^2$.

Example 50

An organic EL device as shown in FIG. 3 was prepared as described in Example 47, except using Compound [II]-(4) as an electron-transporting material. Applying 10 V DC to the device generated a luminescence of 700 cd/m$^2$.

Example 51

An organic EL device as shown in FIG. 3 was prepared as described in Example 47, except using Compound [II]-(5) as an electron-transporting material. Applying 10 V DC to the device generated a luminescence of 400 cd/m$^2$.

Different embodiments of this invention will be specifically described with examples of an organic EL device in which a compound in [III] is used.

In Examples 52 to 62, only a compound in [III] is used for a luminescent layer of an organic EL device. In Examples 63 to 68, a mixture comprising a compound in [III] is used in a luminescent layer. In Examples 69 to 72, a compound in [III] is used in a hole-transporting layer. In Example 73, a compound in [III] is used in an electron-transporting layer.

Example 52

The organic EL device of this example consists of a substrate 1 on which a laminated film consisting of an anode 2, a luminescent layer 4 and a cathode 6 is formed, as shown in FIG. 1.

On a glass substrate 1, ITO was deposited as an anode 2 by spattering, with a sheet resistance of 20 Ω/□. On the anode 2, a layer of Compound [III]-(3) was deposited to 40 nm thick as a luminescent layer 4, by vacuum evaporation. Then, magnesium-silver alloy as a cathode 6 was deposited to 200 nm thick, by vacuum evaporation, to give an organic EL device.

Applying 5 V DC to the organic EL device generated a luminescence with a luminance of 90 cd/m$^2$.

Example 53

An analogous organic EL device was prepared as described in Example 52, except forming a luminescent layer 4 from Compound [III]-(4).

Applying 5 V DC to the organic EL device generated a luminescence with a luminance of 250 cd/m$^2$.

Example 54

An analogous organic EL device was prepared as described in Example 52, except forming a luminescent layer 4 from Compound [III]-(5).

Applying 5 V DC to the organic EL device generated a luminescence with a luminance of 300 cd/m$^2$.

Example 55

An analogous organic EL device was prepared as described in Example 52, except forming a luminescent layer 4 from Compound [III]-(6).

Applying 5 V DC to the organic EL device generated a luminescence with a luminance of 480 cd/m$^2$.

Example 56

An analogous organic EL device was prepared as described in Example 52, except forming a luminescent layer 4 from Compound [III]-(7).

Applying 5 V DC to the organic EL device generated a luminescence with a luminance of 600 cd/m$^2$.

Example 57

An analogous organic EL device was prepared as described in Example 52, except forming a luminescent layer 4 (40 nm thick) on an anode 2, by spin coating with a solution of Compound [III]-(7) in chloroform.

Applying 5 V DC to the organic EL device generated a luminescence with a luminance of 210 cd/m$^2$.

Example 58

The organic EL device of this example has a cross section as shown in FIG. 2.

The device consists of a substrate 1 on which a laminated film consisting of an anode 2, a hole-transporting layer 3, a luminescent layer 4, an electron-transporting layer 5 and a cathode 6, as shown in FIG. 2.

On a glass substrate 1, ITO was deposited as an anode 2 by spattering, with a sheet resistance of 20 Ω/□. On the anode 2 was deposited N,N'-diphenyl-N,N'-bis(3-methylphenyl)-[1,1'-biphenyl]-4,4'-diamine(Compound [02]) 50 nm thick as a hole-transporting layer 3, by vacuum evaporation.

Then, Compound [III]-(3) was deposited to 40 nm thick as a luminescent layer 4, by vacuum evaporation. Then, 2-(4-biphenylyl)-5-(4-t-butylphenyl)-1,3,4-oxadiazole (Compound [07]) was deposited to 20 nm thick as an electron-transporting layer 5, by vacuum evaporation. Then, magnesium-silver alloy as a cathode was deposited to 200 nm thick, by vacuum evaporation, to give an organic EL device.

Applying 10 V DC to the device generated a luminescence with a luminance of 920 cd/m$^2$.

Example 59

An analogous organic EL device was prepared as described in Example 58, except forming a luminescent layer 4 from Compound [III]-(4).

Applying 10 V DC to the organic EL device generated a luminescence with a luminance of 3000 cd/m$^2$.

Example 60

An analogous organic EL device was prepared as described in Example 58, except forming a hole-transporting layer 3 from N,N'-diphenyl-N,N-bis(1-naphthyl)-1,1'-biphenyl-4,4'-diamine(Compound [03]) and an electron-transporting layer 5 from bis{2-(4-t-butylphenyl)-1,3,4-oxadiazole}-m-phenylene(Compound [08]).

Applying 10 V DC to the organic EL device generated a luminescence with a luminance of 1200 cd/m$^2$.

Example 61

An analogous organic EL device was prepared as described in Example 58, except forming a hole-transporting layer 3 from Compound [04], a luminescent layer 4 from Compound [III]-(5) and an electron-transporting layer 5 from Compound [11].

Applying 10 V DC to the organic EL device generated a luminescence with a luminance of 3400 cd/m$^2$.

Example 62

An analogous organic EL device was prepared as described in Example 58, except forming a hole-transporting layer 3 from Compound [05], a luminescent layer 4 from Compound [III]-(7) and an electron-transporting layer 5 from Compound [12].

Applying 10 V DC to the organic EL device generated a luminescence with a luminance of 4500 cd/m$^2$.

Example 63

The organic EL device as shown FIG. 3 will be described.

The device of this example consists of a substrate 1 on which a laminated film consisting of an anode 2, a luminescent layer 4, an electron-transporting layer 5 and a cathode 6, as shown in FIG. 3.

On a glass substrate 1, ITO was deposited as an anode 2 by spattering, with a sheet resistance of 20 Ω/□. On the anode 2 was co-deposited in vacuo N,N'-diphenyl-N,N'-bis(1-naphthyl)-1,1'-biphenyl-4,4'-diamine(Compound [03]) and Compound [III]-(3) (1:10 by weight) 50 nm thick as a luminescent layer 4.

Then, on the luminescent layer 4 was deposited Compound [09] 50 nm thick as an electron-transporting layer 5, by vacuum evaporation. Then, on the electron-transporting layer 5, magnesium-silver alloy as a cathode 6 was deposited to 200 nm thick, by vacuum evaporation, to give an organic EL device.

Applying 10 V DC to the device generated a luminescence with a luminance of 900 cd/m$^2$.

Example 64

An analogous organic EL device was prepared as described in Example 63, except using Compound [III]-(5) in place of Compound [III]-(3) as a material for a luminescent layer 4.

Applying 10 V DC to the organic EL device generated a luminescence with a luminance of 2300 cd/m$^2$.

Example 65

An analogous organic EL device was prepared as described in Example 63, except forming a luminescent layer 4 (40 nm thick) by spin coating with a solution of Compound [III]-(7) and N,N'-diphenyl-N,N'-bis(1-naphthyl)-1,1'-biphenyl-4,4'-diamine(Compound [03]) (1:10 molar ratio) in chloroform, and using Compound [10] as a material for an electron-transporting layer 5.

Applying 10 V DC to the organic EL device generated a luminescence with a luminance of 900 cd/m$^2$.

Example 66

The organic EL device as shown FIG. 4 will be described.

The device of this example consists of a substrate 1 on which a laminated film consisting of an anode 2, a hole-transporting layer 3, a luminescent layer 4 and a cathode 6, as shown in FIG. 4.

On a glass substrate 1, ITO was deposited as an anode 2 by spattering, with a sheet resistance of 20 Ω/□. On the anode 2 was deposited N,N'-diphenyl-N,N'-bis(1-naphthyl)-1,1'-biphenyl-4,4'-diamine(Compound [03]) 50 nm thick as a hole-transporting layer 3, by vacuum evaporation.

Then, a luminescent layer 4 was formed by co-depositing in vacuo Compounds [11] and [III]-(3) (20:1 by weight) 50 nm thick. Then, magnesium-silver alloy as a cathode 6 was deposited to 200 nm thick, to give an organic EL device.

Applying 10 V DC to the device generated a luminescence with a luminance of 1100 cd/m$^2$.

Example 67

An analogous organic EL device was prepared as described in Example 66, except co-depositing in vacuo Compounds [11] and [III]-(5) (20:1 by weight) 50 nm thick as a luminescent layer 4.

Applying 10 V DC to the organic EL device generated a luminescence with a luminance of 1800 cd/m$^2$.

Example 68

An analogous organic EL device was prepared as described in Example 66, except forming a hole-transporting layer 3 using N,N'-diphenyl-N,N'-bis(3-methylphenyl)-[1,1'-biphenyl]-4,4'-diamine(Compound [02]), and co-depositing in vacuo Compounds [13] and [III]-(7) (20:1 by weight) as a luminescent layer 4.

Applying 10 V DC to the organic EL device generated a luminescence with a luminance of 2300 cd/m$^2$.

Example 69

An analogous organic EL device was prepared as described in Example 58, except forming a hole-transporting layer 3 and a luminescent layer 4 using Compounds [III]-(4) and [13], respectively.

Applying 10 V DC to the organic EL device generated a luminescence with a luminance of 850 cd/m$^2$.

Example 70

An analogous organic EL device was prepared as described in Example 69, except forming a hole-transporting layer 3 using Compound [III]-(5).

Applying 10 V DC to the organic EL device generated a luminescence with a luminance of 1300 cd/m$^2$.

Example 71

An analogous organic EL device was prepared as described in Example 69, except forming a hole-transporting layer 3 using Compound [III]-(6).

Applying 10 V DC to the organic EL device generated a luminescence with a luminance of 1500 cd/m$^2$.

Example 72

An analogous organic EL device was prepared as described in Example 69, except forming a hole-transporting layer 3 using Compound [III]-(7).

Applying 10 V DC to the organic EL device generated a luminescence with a luminance of 1800 cd/m$^2$.

Example 73

An analogous organic EL device was prepared as described in Example 58, except forming a hole-transporting layer 3, a luminescent layer 4 and an electron-transporting layer 5 using N,N'-diphenyl-N,N-bis(1-naphthyl)-1,1'-biphenyl-4,4'-diamine(Compound [03]), Compound [13] and Compound [III]-(3), respectively.

Applying 10 V DC to the organic EL device generated a luminescence with a luminance of 980 cd/m$^2$.

Among the organic EL devices of Examples 52 to 57 whose luminescence properties were tested by applying 5 V DC, the device of Example 56 using Compound [III]-(7) showed the highest luminance. Among the organic EL devices of Examples 58 to 73 whose luminescence properties were tested by applying 10 V DC, the device of Example 62, in which a luminescent layer comprising Compound [III]-(7) is inserted between a hole-transporting layer and an electron-transporting layer, showed the highest luminance.

This demonstrates that Compound [III]-(7) is remarkably effective for improving luminescence properties of an EL device.

The followings are examples where a compound in [IV] is used as a luminescent layer (Examples 74 to 82); a mixture layer of the compound and a hole-transporting material as a luminescent layer (Examples 83 to 85); a mixture layer of the compound and an electron-transporting material as a luminescent layer (Examples 86 and 87), the compound as a hole-transporting layer (Examples 88 to 91) or the compound as an electron-transporting layer (Examples 92 to 95).

Example 74

FIG. 1 shows the cross section of the device in this example, whose preparation procedure is similar to that in Example 1. The device consists of an anode 2/a luminescent layer 4/a cathode 6. On a glass substrate 1, ITO was deposited as an anode by spattering, with a sheet resistance of 20 Ω/□. On the anode, Compound [IV]-(3) was deposited to 40 nm thick as a luminescent layer, by vacuum evaporation. Then, magnesium-silver alloy as a cathode was deposited to 200 nm thick, by vacuum evaporation, to give an organic EL device. Applying 5 V DC to the device generated a luminescence of 20 cd/m$^2$.

Example 75

An organic EL device was prepared as described in Example 74, except using Compound [IV]-(4) as a luminescent material. Applying 5 V DC to the device generated a luminescence of 100 cd/m$^2$.

Example 76

An organic EL device was prepared as described in Example 74, except using Compound [IV]-(5) as a luminescent material. Applying 5 V DC to the device generated a luminescence of 400 cd/m$^2$.

Example 77

An organic EL device was prepared as described in Example 74, except using Compound [IV]-(6) as a luminescent material. Applying 5 V DC to the device generated a luminescence of 600 cd/m$^2$.

Example 78

On a glass substrate, ITO was deposited as an anode by spattering, with a sheet resistance of 20 Ω/□. On the anode was formed a luminescent layer 40 nm thick, by spin coating with a solution of Compound [IV]-(6) in chloroform. Then, magnesium-silver alloy as a cathode was deposited to 200 nm thick, by vacuum evaporation, to give an organic EL device. Applying 5 V DC to the device generated a luminescence of 120 cd/m$^2$.

Example 79

FIG. 2 shows the cross section of the device in this example. The device consists of an anode 2/a hole-transporting layer 3/a luminescent layer 4/an electron-transporting layer 5/a cathode 6. On a glass substrate 1, ITO was deposited as an anode by spattering, with a sheet resistance of 20 Ω/□. On the anode was deposited N,N'-diphenyl-N,N'-bis(3-methylphenyl)-[1,1'-biphenyl]-4,4'-diamine[02] 50 nm thick as a hole-transporting layer by vacuum evaporation. Then, Compound [IV]-(3) was deposited to 40 nm thick as a luminescent layer, by vacuum evaporation. Then, 2-(4-biphenylyl)-5-(4-t-butylphenyl)-1,3,4-oxadiazole[07] was deposited to 20 nm thick as an electron-transporting layer, by vacuum evaporation. Then, magnesium-silver alloy as a cathode was deposited to 200 nm thick, by vacuum evaporation, to give an organic EL device. Applying 10 V DC to the device generated a luminescence of 800 cd/m².

Example 80

An organic EL device was prepared as described in Example 79, except using Compound [IV]-(4) as a luminescent material. Applying 10 V DC to the device generated a luminescence of 1800 cd/m².

Example 81

An organic EL device was prepared as described in Example 79, except using N,N'-diphenyl-N,N-bis(1-naphthyl)-1,1'-biphenyl-4,4'-diamine[03] as a hole-transporting layer and bis{2-(4-t-butylphenyl)-1,3,4-oxadiazole}-m-phenylene[08] as an electron-transporting layer. Applying 10 V DC to the device generated a luminescence of 1300 cd/m².

Example 82

An organic EL device was prepared as described in Example 79, except using Compound [05] as a hole-transporting layer, Compound [IV]-(6) as a luminescent layer and Compound [12] as an electron-transporting layer. Applying 10 V DC to the device generated a luminescence of 6000 cd/m².

Example 83

FIG. 4 shows the cross section of the device in this example. The device consists of an anode 2/a luminescent layer 4/an electron-transporting layer 5/a cathode 6. On a glass substrate 1, ITO was deposited as an anode by spattering, with a sheet resistance of 20 Ω/□. On the anode was co-deposited in vacuo N,N'-diphenyl-N,N-bis(1-naphthyl)-1,1'-biphenyl-4,4'-diamine[03] and Compound [IV]-(3) (1:10 by weight) 50 nm thick as a luminescent layer. Then, Compound [9] was deposited to 50 nm thick as an electron-transporting layer, by vacuum evaporation. Then, magnesium-silver alloy as a cathode was deposited to 200 nm thick, to give an organic EL device. Applying 10 V DC to the device generated a luminescence of 970 cd/m².

Example 84

An organic EL device was prepared as described in Example 83, except using Compound [IV]-(4) in place of Compound [IV]-(3). Applying 10 V DC to the device generated a luminescence of 2200 cd/m².

Example 85

On a glass substrate, ITO was deposited as an anode by spattering, with a sheet resistance of 20 Ω/□. On the anode was formed a luminescent layer 40 nm thick, by spin coating with a solution of Compound [IV]-(6) and N,N'-diphenyl-N,N-bis(1-naphthyl)-1,1'-biphenyl-4,4'-diamine[03] (1:10 molar ratio) in chloroform. Then, Compound [10] was deposited to 50 nm thick as an electron-transporting layer, by vacuum evaporation. Then, magnesium-silver alloy as a cathode was deposited to 200 nm thick, by vacuum evaporation, to give an organic EL device. Applying 10 V DC to the device generated a luminescence of 1300 cd/m².

Example 86

FIG. 3 shows the cross section of the device in this example. The device consists of an anode 2/a hole-transporting layer 3/a luminescent layer 4/a cathode 6. On a glass substrate 1, ITO was deposited as an anode by spattering, with a sheet resistance of 20 Ω/□. On the anode was deposited N,N'-diphenyl-N,N-bis(1-naphthyl)-1,1'-biphenyl)-4,4'-diamine[03] 50 nm thick as a hole-transporting layer, by vacuum evaporation. Then, Compounds [11] and [IV]-(3) (20:1 by weight) were deposited to 50 nm thick as a luminescent layer, by vacuum evaporation. Then, magnesium-silver alloy as a cathode was deposited to 200 nm thick, to give an organic EL device. Applying 10 V DC to the device generated a luminescence of 1150 cd/m².

Example 87

An organic EL device was prepared as described in Example 86, except co-depositing in vacuo Compounds [11] and [IV]-(4) (20:1 by weight) as a luminescent layer. Applying 10 V DC to the device generated a luminescence of 2100 cd/m².

Example 88

An organic EL device was prepared as described in Example 86, except using N,N'-diphenyl-N,N'-bis(3-methylphenyl)-[1,1'-biphenyl]-4,4'-diamine[02] as a hole-transporting layer and co-depositing in vacuo Compounds [13] and [IV]-(6) (20:1 by weight) as a luminescent layer. Applying 10 V DC to the device generated a luminescence of 3000 cd/m².

Example 89

An organic EL device was prepared as described in Example 79, except using Compound [IV]-(4) as a hole-transporting layer and Compound [13] as a luminescent layer. Applying 10 V DC to the device generated a luminescence of 800 cd/m².

Example 90

An organic EL device was prepared as described in Example 89, except using Compound [IV]-(5) as a hole-transporting layer. Applying 10 V DC to the device generated a luminescence of 1300 cd/m².

Example 91

An organic EL device was prepared as described in Example 89, except using Compound [IV]-(6) as a hole-transporting layer. Applying 10 V DC to the device generated a luminescence of 1800 cd/m².

Example 92

An organic EL device was prepared as described in Example 79, except using N,N'-diphenyl-N,N-bis(1-naphthyl)-1,1'-biphenyl-4,4'-diamine[03] as a hole-transporting layer, Compound [13] as a luminescent layer and Compound [IV]-(3) as an electron-transporting layer. Applying 10 V DC to the device generated a luminescence of 890 cd/m².

Example 93

An organic EL device was prepared as described in Example 92, except using Compound [IV]-(4) as an electron-transporting layer. Applying 10 V DC to the device generated a luminescence of 700 cd/m².

Example 94

An organic EL device was prepared as described in Example 92, except using Compound [IV]-(5) as an electron-transporting layer. Applying 10 V DC to the device generated a luminescence of 500 cd/m$^2$.

Example 95

An organic EL device was prepared as described in Example 92, except using Compound [IV]-(6) as an electron-transporting layer. Applying 10 V DC to the device generated a luminescence of 400 cd/m$^2$.

What is claimed is:

1. An organic electroluminescence device having one or more organic thin layers including a luminescent layer between an anode and a cathode, wherein at least one of the organic thin layers contains at least one of compounds selected from the group consisting of the compounds represented by general formulas I, II, III, and IV, alone or in combination;

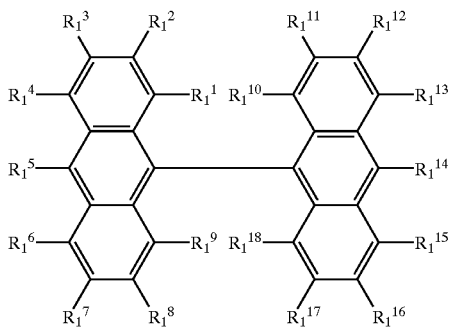

I wherein $R_1^1$ to $R_1^{18}$ independently represent hydrogen, halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_1^1$ to $R_1^9$ or two of $R_1^{10}$ to $R_1^{18}$ may be combined together to form a ring, although at least one of $R_1^1$ to $R_1^{18}$ is a diarylamino group represented by —NAr$_1^1$Ar$_1^2$ wherein Ar$_1^1$ and Ar$_1^2$ independently represent a substituted or unsubstituted aryl group having 6 to 20 carbon atoms;

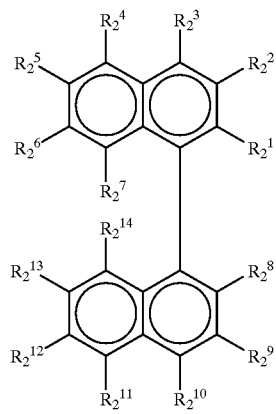

II wherein $R_2^1$ to $R_2^{14}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_2^1$ to $R_2^7$, or $R_2^8$ to $R_2^{14}$ may form a ring, although at least one of $R_2^1$ to $R_2^{14}$ is a diarylamino group represented by —NAr$_2^1$Ar$_2^2$ wherein Ar$_2^1$ is a substituted aryl group having 6 to 20 carbon atoms which has at least one substituted or unsubstituted styryl substituent and Ar$_2^2$ is a substituted or unsubstituted aryl group having 6 to 20 carbon atoms;

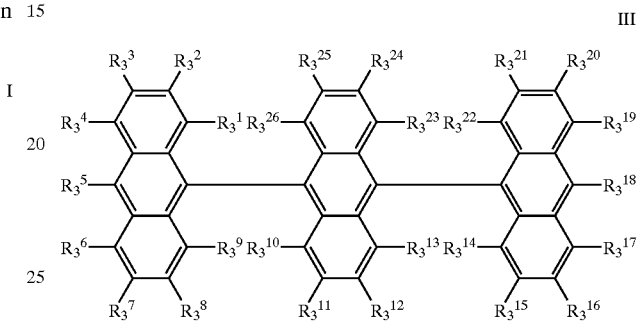

III wherein $R_3^1$ to $R_3^{26}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_3^1$ to $R_3^9$, or two of $R_3^{10}$ to $R_3^{13}$ and two of $R_3^{23}$ to $R_3^{26}$, or two of $R_3^{14}$ to $R_3^{22}$ may form a ring, although at least one of $R_3^1$ to $R_3^{26}$ is a diarylamino group represented by —NAr$_3^1$Ar$_3^2$ wherein Ar$_3^1$ and Ar$_3^2$ are independently a substituted or unsubstituted aryl group having 6 to 20 carbon atoms;

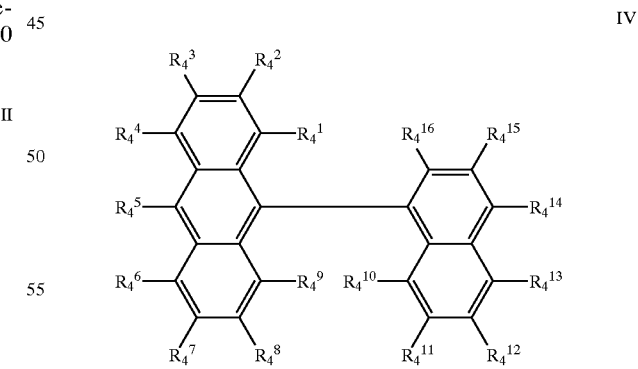

IV wherein $R_4^1$ to $R_4^{16}$ independently represent hydrogen, a halogen, hydroxy, a substituted or unsubstituted amino, nitro, cyano, a substituted or unsubstituted alkyl, a substituted or unsubstituted alkenyl, a substituted or unsubstituted cycloalkyl, a substituted or unsubstituted alkoxy, a substituted or unsubstituted aromatic hydrocarbon, a substituted or unsubstituted aromatic heterocycle, a substituted or unsubstituted aralkyl, a substituted or unsubstituted aryloxy, a substituted or unsubstituted alkoxycarbonyl, or carboxyl groups; or two of $R_4^1$ to $R_4^9$, or $R_4^{10}$ to $R_4^{16}$ may form a ring, although at least one of $R_4^1$ to $R_4^{16}$ is a diarylamino group represented by —$NAr_4^1Ar_4^2$ wherein $Ar_4^1$ and $Ar_4^2$ are independently a substituted or unsubstituted aryl group having 6 to 20 carbon atoms.

2. An organic electroluminescence device as claimed in claim 1, wherein the compound is a bianthryl compound represented by general formula I.

3. An organic electroluminescence device as claimed in claim 1, wherein the compound is a naphthyl compound represented by general formula II.

4. An organic electroluminescence device as claimed in claim 1, wherein the compound is a trianthrylene compound represented by general formula III.

5. An organic electroluminescence device as claimed in claim 1, wherein the compound is a naphthylanthracene compound represented by general formula IV.

6. An organic electroluminescence device as claimed in claim 1, wherein the at least one of the organic thin layers is a hole-transporting layer.

7. An organic electroluminescence device as claimed in claim 1, wherein the at least one of the organic thin layers is an electron-transporting layer.

8. An organic electroluminescence device as claimed in claim 1, wherein the at least one of the organic thin layers is the luminescent layer.

9. An organic electroluminescence device as claimed in claim 1, wherein the at least one compound is represented by general formula I, and at least one of $Ar_1^1$ and $Ar_1^2$ in —$NAr_1^1Ar_1^2$ group has one substituted or unsubstituted styryl group as a substitutent.

10. An organic electroluminescence device as claimed in claim 1, wherein the at least one compound is represented by general formula III, and at least one of $Ar_3^1$ and $Ar_3^2$ in —$NAr_3^1Ar_3^2$ group has one substituted or unsubstituted styryl group as a substituent.

11. An organic electroluminescence device as claimed in claim 1, wherein the at least one compound is represented by the general formula IV, and at least one of $Ar_4^1$ and $Ar_4^2$ in —$NAr_4^1Ar_4^2$ group has one substituted or unsubstituted styryl group as a substitutent.

* * * * *